United States Patent
Kim et al.

(10) Patent No.: US 10,727,443 B2
(45) Date of Patent: Jul. 28, 2020

(54) ORGANIC LIGHT EMITTING DISPLAY

(71) Applicant: SAMSUNG SDI CO., LTD., Yongin-si, Gyeonggi-do (KR)

(72) Inventors: Hye Jin Kim, Suwon-si (KR); Sung Min Ko, Suwon-si (KR); Mi Sun Kim, Suwon-si (KR); Seong Ryong Nam, Suwon-si (KR); Ji Yeon Lee, Suwon-si (KR); Mi Jeong Choi, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 428 days.

(21) Appl. No.: 15/573,624

(22) PCT Filed: May 2, 2016

(86) PCT No.: PCT/KR2016/004593
§ 371 (c)(1),
(2) Date: Nov. 13, 2017

(87) PCT Pub. No.: WO2016/204398
PCT Pub. Date: Dec. 22, 2016

(65) Prior Publication Data
US 2018/0090714 A1    Mar. 29, 2018

(30) Foreign Application Priority Data
Jun. 19, 2015  (KR) .......................... 10-2015-0087819

(51) Int. Cl.
*H01L 51/52* (2006.01)
*H01L 51/56* (2006.01)
*H05B 33/22* (2006.01)
*H01L 51/00* (2006.01)

(52) U.S. Cl.
CPC ........ *H01L 51/5256* (2013.01); *H01L 51/004* (2013.01); *H01L 51/0043* (2013.01); *H01L 51/5246* (2013.01)

(58) Field of Classification Search
CPC ............... H01L 51/5256; H01L 51/004; H01L 51/0043; H01L 51/5246; H01L 51/52; H01L 51/56; H05B 33/22; H05B 33/04
(Continued)

(56) References Cited

FOREIGN PATENT DOCUMENTS

| CN | 101944537 B | 6/2013 |
|---|---|---|
| CN | 103337478 A | 10/2013 |

(Continued)

OTHER PUBLICATIONS

International Search report for PCT/KR2016/004593 filed on May 2, 2016.
Office Action dated Dec. 5, 2018 in the corresponding Chinese Patent Application No. 2016800355769.

*Primary Examiner* — William K Cheung
(74) *Attorney, Agent, or Firm* — Lee IP Law, P.C.

(57) ABSTRACT

Provided is an organic light emitting display comprising: a substrate including a light emitting zone and a non-light emitting zone, which is positioned around the outside of the light emitting zone; at least one organic light emitting diode formed on the light emitting zone; an encapsulation layer for sealing the organic light emitting diode; and a dam formed on the non-light emitting zone, wherein the encapsulation layer includes a structure in which at least one inorganic layer and at least one organic layer are alternatingly stacked, wherein the organic layer is made from a display sealing material composition, and wherein the display sealing material composition comprises a photo-curable monomer and a photopolymerization initiator. The photo-curable monomer comprises: a monomer not having an aromatic hydrocarbon group; and a monomer, represented by chemical formula 1, having at least two substituted or non-substituted phenyl groups, wherein the photo-curable monomer comprises approximately 5 wt. % to 45 wt. % of the monomer having the at least two substituted or non-substituted phenyl groups, (Continued)

and approximately 55 wt. % to 95 wt. % of a monomer not having the aromatic hydrocarbon group.

20 Claims, 4 Drawing Sheets

(58) Field of Classification Search
USPC .................................................... 428/411.1
See application file for complete search history.

(56) References Cited

FOREIGN PATENT DOCUMENTS

| | | | | |
|---|---|---|---|---|
| JP | 2014-193970 | A | * | 10/2014 |
| JP | 2014193970 | A | † | 10/2014 |
| KR | 10-2011-0071039 | A | | 6/2011 |
| KR | 10-2014-0066748 | A | | 6/2014 |
| KR | 10-2014-0123328 | A | | 10/2014 |
| KR | 10-2014-0140769 | A | * | 12/2014 |
| KR | 20140140769 | A | † | 12/2014 |
| KR | 10-2015-0019196 | A | | 2/2015 |
| KR | 10-2015-0024471 | A | * | 3/2015 |
| KR | 20150024471 | A | † | 3/2015 |

\* cited by examiner
† cited by third party

ORGANIC LIGHT EMITTING DISPLAY

CROSS REFERENCE TO RELATED APPLICATIONS

This is the U.S. national phase application based on PCT Application No. PCT/KR2016/004593, filed May 2, 2016, which is based on Korean Patent Application No. 10-2015-0087819, filed Jun. 19, 2015, the entire contents of all of which are hereby incorporated by reference.

TECHNICAL FIELD

The invention relates to an organic light emitting display.

BACKGROUND ART

Organic light emitting elements are vulnerable to moisture and/or oxygen. Organic light emitting elements may suffer from delamination at an interface between a metal field and a light emitting layer due to moisture. The organic light emitting elements may have high resistance due to oxidation of metals and may suffer from degradation of organic materials in the light emitting layer due to moisture and/or oxygen. The organic light emitting element may suffer from deterioration in light emission property due to oxidation of the light emitting layer or the metal field by outgassing inside or outside the organic light emitting elements. Thus, the organic light emitting element must be encapsulated by an encapsulation composition capable of protecting the organic light emitting element from moisture and/or oxygen.

The organic light emitting element may be encapsulated by an encapsulation layer having a multilayer structure in which an organic layer and an inorganic layer are alternately stacked one above another. The inorganic layer may be formed by plasma deposition. However, the organic layer may be etched by plasma. Etching may deteriorate an encapsulation function of the organic layer and provide adverse influence on formation of the inorganic layer. The organic layer is formed in contact with the inorganic layer. As a result, the organic light emitting element may suffer from deterioration in light emitting property and reliability.

The organic layer may be formed by deposition or ink jetting. When the corner of the organic layer is exposed to the corner of an encapsulation layer without protection, an encapsulation property which protects the organic light emitting element from moisture and/or oxygen may be deteriorated. In addition, when the organic layer is formed by ink jetting, an encapsulation composition for an organic layer in a liquid state may spread to a light emitting area or outside of a substrate, thereby thickening the edge of the encapsulation layer.

The background technique of the invention is disclosed in Korean Patent Laid-Open Publication No. 2011-0071039.

DISCLOSURE

Technical Problem

It is one aspect of the invention to provide an organic light emitting display device that includes an organic layer exhibiting high plasma resistance.

It is another aspect of the invention to provide an organic light emitting display device that includes an organic layer having considerably low water vapor permeability and/or oxygen permeability.

It is a further aspect of the invention to provide an organic light emitting display device that includes an organic layer exhibiting excellent transparency.

It is yet another aspect of the invention to provide an organic light emitting display device that includes an organic layer having low surface roughness and good surface flatness.

It is yet another aspect of the invention to provide an organic light emitting display device that includes an organic layer capable of securing reliability in elapsed time by protecting an organic light emitting element from an external environment including moisture and/or oxygen.

It is yet another aspect of the invention to provide an organic light emitting display device which may suppress an organic layer from being exposed to outside of a light emitting area or a substrate and may suppress an edge of the organic layer from being thickened.

Technical Solution

One aspect of the invention relates to an organic light emitting display device including a substrate including a light emitting area and a non-light emitting area disposed outside of the light emitting area; at least one organic light emitting element formed on the light emitting area; an encapsulation layer encapsulating the organic light emitting element; and a dam formed on the non-light emitting area, wherein the encapsulation layer has a structure in which at least one inorganic layer and at least one organic layer are alternately stacked one above another, and the organic layer includes a composition for encapsulating a display device, the composition for encapsulating a display device including a photocurable monomer and a photopolymerization initiator, the photocurable monomer including a monomer without an aromatic hydrocarbon; and a monomer of Formula 1 including substituted or non-substituted at least two phenyl groups, the photocurable monomer including about 5 wt % to about 45 wt % of the monomer including substituted or non-substituted at least two phenyl groups and about 55 wt % to about 95 wt % of the monomer without an aromatic hydrocarbon.

[Formula 1]

wherein in Formula 1, A, $Z^1$, $Z^2$, a and b are as defined below.

Advantageous Effects

The invention provides an organic light emitting display device that includes an organic layer exhibiting high plasma resistance.

The invention provides an organic light emitting display device that includes an organic layer having considerably low water vapor permeability and oxygen permeability.

The invention provides an organic light emitting display device that includes an organic layer exhibiting excellent transparency.

The invention provides an organic light emitting display device having low surface roughness and good surface flatness.

The invention provides an organic light emitting display device that includes an organic layer capable of securing reliability in elapsed time by protecting an organic light emitting element from an external environment including moisture and gas.

The invention provides an organic light emitting display device which may suppress an organic layer from being exposed to outside of a light emitting area or a substrate and may suppress an edge of the organic layer from being thickened.

BEST MODE

Figure 1:
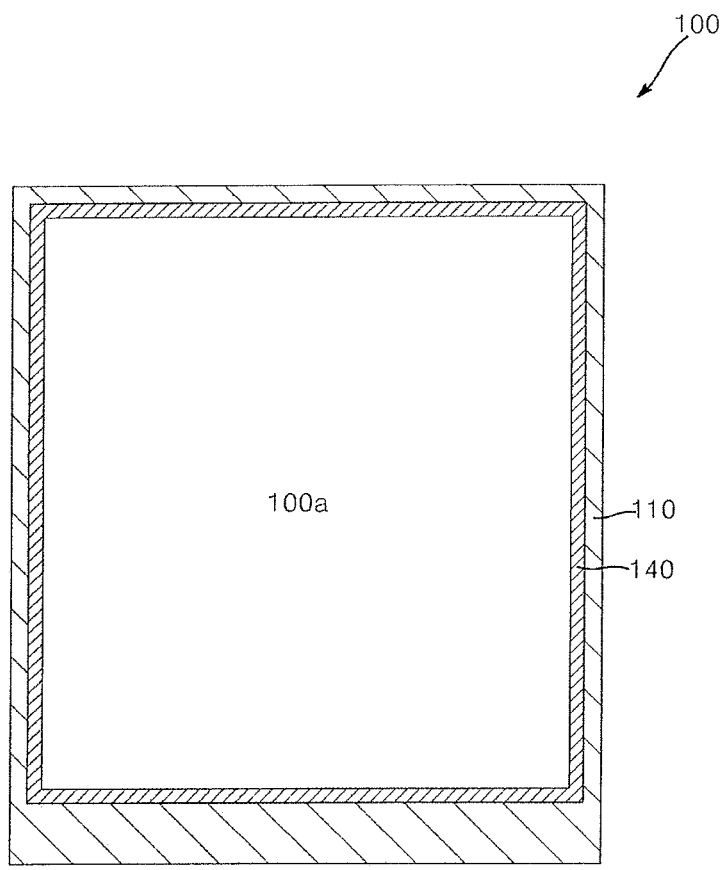
FIG. 1 is a schematic plan view of an organic light emitting display device according to an embodiment of the invention.

Hereinafter, embodiments of the invention will be described in detail with reference to the accompanying drawings. It should be understood that the invention is not limited to the following embodiments and may be embodied in different ways, and that the following embodiments are given to provide complete disclosure of the invention and to provide a thorough understanding of the invention to those skilled in the art. It should be noted that the drawings are not to precise scale and some of the dimensions, such as width, length, thickness, and the like, are exaggerated for clarity of description in the drawings. Further, although only a portion of a component is illustrated for convenience of description, other portions of the component can become apparent to those skilled in the art. Furthermore, it should be understood that the invention can be realized in various ways by those skilled in the art without departing from the spirit and scope of the invention.

As used herein, spatially relative terms such as "upper" and "lower" are defined with reference to the accompanying drawings. Thus, it will be understood that "upper" can be used interchangeably with "lower". It will be understood that when a layer is referred to as being "on" another layer, it can be directly formed on the other layer, or intervening layer(s) may also be present. Thus, it will be understood that when a layer is referred to as being "directly on" another layer, no intervening layer is interposed therebetween.

As used herein, the term "(meth)acryl" refers to acryl and/or methacryl.

Unless otherwise stated herein, the term "substituted" means that at least one hydrogen atom in a functional group is substituted with a hydroxyl group, a nitro group, an imino group (=NH, =NR, R being a $C_1$ to $C_{10}$ alkyl group), an amidino group, a hydrazine group, a hydrazone group, a carboxyl group, a $C_1$ to $C_{20}$ alkyl group, a $C_6$ to $C_{30}$ aryl group, a $C_3$ to $C_{30}$ heteroaryl group, or a $C_2$ to $C_{30}$ heterocycloalkyl group.

As used herein, the term "hetero atom" refers to an atom selected from the group consisting of N, O, S, and P, and the term "hetero" means that a carbon atom is substituted with an atom selected from the group consisting of N, O, S, and P.

As used herein, the term "plasma resistance" may be determined from an etch rate when a cured composition for encapsulation was treated with plasma, and a low etch rate is defined as a good plasma resistance.

As used herein, the term "alkylene group" refers to an alkanediyl group having a saturated hydrocarbon without a double bond, and having two bonding groups.

As used herein, the term "alkoxylene group" refers to "—OR—" having two bonding groups, while R referring to an alkylene group.

As used herein, the terms "encapsulation" and "seal" refer to surrounding an organic light emitting element and the terms have substantially the same meaning with each other.

The organic light emitting display device of the invention may include a substrate including a light emitting area, and a non-light emitting area disposed outside of the light emitting area; at least one organic light emitting element formed on the light emitting area; an encapsulation layer encapsulating the organic light emitting element; and a dam formed on the non-light emitting area, wherein the encapsulation layer has a structure in which at least one inorganic layer and at least one organic layer are alternately stacked one above another, and the organic layer includes a composition for encapsulating a display device.

The composition for encapsulating a display device according to embodiments of the invention may implement an organic layer having high plasma resistance and low surface roughness. In an organic light emitting display device according to embodiments of the invention, an organic layer is formed in contact with an inorganic layer. Thus, the organic layer may flatten the inorganic layer and prevent defects of the inorganic layer, thereby preventing permeation of external moisture and oxygen. And a thin encapsulation layer may be formed.

The composition for encapsulating a display device according to the invention may implement an organic layer having low water vapor permeation and oxygen permeation. Therefore, the organic light emitting display device of the invention may further inhibit permeation of external moisture and/or oxygen into the organic light emitting element and improve reliability in elapsed time of the organic light emitting element.

The organic light emitting display device according to the invention may include a dam. The dam may prevent corners of the organic layer from being exposed to outside. Therefore, the organic light emitting display device of the invention may further suppress permeation of external moisture and/or oxygen into the organic light emitting element and increase reliability in elapsed time of the organic light emitting element.

The organic light emitting display device according to the invention may include a dam. The dam may suppress the composition for encapsulation which is included in the organic layer from flowing to outside of a light emitting area or a substrate during formation of the organic layer, thereby suppressing the organic layer from being formed outside of the light emitting area or the substrate and also suppressing thickening of the edges of the organic layer.

For example, in the organic light emitting display device of the invention, the inorganic layer may be additionally formed on the dam. In an embodiment, the dam and the inorganic layer may be sequentially formed on the substrate. In another embodiment, the inorganic layer may include a first inorganic layer and a second inorganic layer, and the dam, the first inorganic layer, and the second inorganic layer may be sequentially formed on the substrate.

Further, in the organic light emitting display device of the invention, the encapsulation layer may be additionally formed on the dam. In an embodiment, the dam, the organic layer, and the inorganic layer may be sequentially formed on the substrate. In another embodiment, the inorganic layer may include a first inorganic layer and a second inorganic layer, and the organic layer may include a first organic layer. The dam, the first inorganic layer, the first organic layer, and the second inorganic layer may be sequentially formed on the substrate.

In addition, in the organic light emitting display device of the invention, the first organic layer in the light emitting area may be separated from the first organic layer in the non-light emitting area by the dam.

Figure 2:
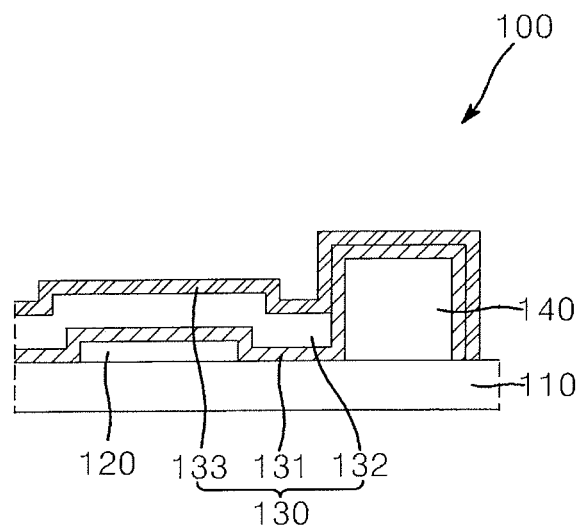
FIG. 2 is a partial cross-sectional view of an organic light emitting display device according to an embodiment of the invention.

Hereinafter, an organic light emitting display device according to an embodiment of the invention will be explained with reference to FIGS. 1 and 2. FIG. 1 is a schematic plan view of an organic light emitting display device according to an embodiment of the invention. FIG. 2 is a partial cross-sectional view of an organic light emitting display device according to an embodiment of the invention.

Referring to FIG. 1, an organic light emitting display device 100 according to an embodiment of the invention may include a substrate 110, a dam 140, and a light emitting area 100a. The substrate 110 may include a light emitting area 100a in which at least one organic light emitting element is formed and a non-light emitting area in which the dam 140 is formed and is located outside of the light emitting area 100a.

Referring to FIG. 2, an organic light emitting display device 100 according to one embodiment may include a substrate 110, an organic light emitting element 120, an encapsulation layer 130, and a dam 140.

The substrate 110 may be disposed under the organic light emitting element 120, the encapsulation layer 130, and the dam 140 to support the organic light emitting element 120, the encapsulation layer 130, and the dam 140. The substrate 110 may include a light emitting area in which at least one organic light emitting element 120 is formed, and a non-light emitting area in which the dam 140 is formed and is located outside of the light emitting area.

The substrate 110 may be a glass substrate, a quartz substrate, or a transparent plastic substrate. The transparent plastic substrate may be applied to flexible products by providing flexibility to the organic light emitting display device. The transparent plastic substrate may be formed of at least one of a polyimide resin, an acrylic resin, a polyacrylate resin, a polycarbonate resin, a polyether resin, a polyester resin including polyethylene terephthalate, and a sulfonic acid resin, without being limited thereto.

The organic light emitting element 120 may be formed on the light emitting area of the substrate 110 to drive the organic light emitting display device 100. The organic light emitting element 120 is a self-emissive device and may include a typical structure known to those skilled in the art.

Specifically, the organic light emitting element 120 may have a structure in which an anode, a hole transport region, a light emitting layer, an electron transport region, and a cathode are sequentially stacked in this order. The hole transport region may include at least one of a hole injection layer, a hole transport layer, and an electron blocking layer. The electron transport region may include at least one of a hole blocking layer, an electron transport layer, and an electron injection layer. Light is emitted from the light emitting layer through recombination of holes generated from the anode and electrons generated from the cathode in the light emitting layer. Details of the anode, the hole transport region, the light emitting layer, the electron transport region, and the cathode are well known to those skilled in the art.

Specifically, the anode may include a material having high work function to allow efficient injection of holes into the light emitting layer. Examples of materials for the anode may include metals such as nickel, platinum, vanadium, chromium, copper, zinc, and gold, metal alloys thereof, metal oxides such as zinc oxide, indium oxide, indium tin oxide, and indium zinc oxide, combinations of metals and metal oxides, such as a combination of zinc oxide and aluminum, a combination of zinc oxide and antimony. The cathode may include a material having low work function to allow easy injection of electrons into an organic light emitting layer. Examples of materials for the cathode may include metals such as magnesium, calcium, sodium, potassium, titanium, indium, yttrium, lithium, gadolinium, aluminum, silver, tin, lead, cesium, barium, or metal alloys thereof.

The light emitting layer may include a material known to those skilled in the art. For example, the light emitting layer may include fluorene derivatives and metal complexes, without being limited thereto.

The hole transport region may include a material such as m-MTDATA, TDATA, 2-TNATA, NPB, β-NPB, TPD, Spiro-TPD, Spiro-NPB, α-NPB, TAPC, HMTPD, PEDOTT/PSS (poly(3,4-ethylenedioxythiophene)/poly(4-styrenesulfonate), and PANT/PSS (polyaniline/poly(4-styrenesulfonate) as follows, without being limited thereto.

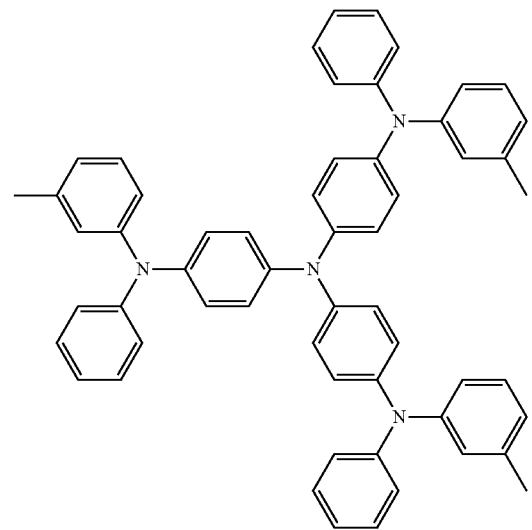

m-MTDATA

-continued
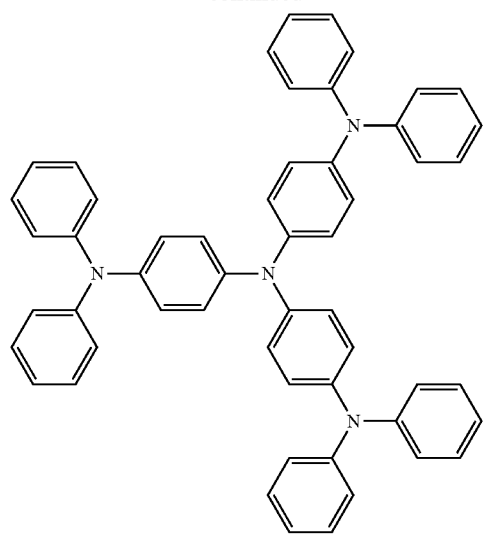
TDATA
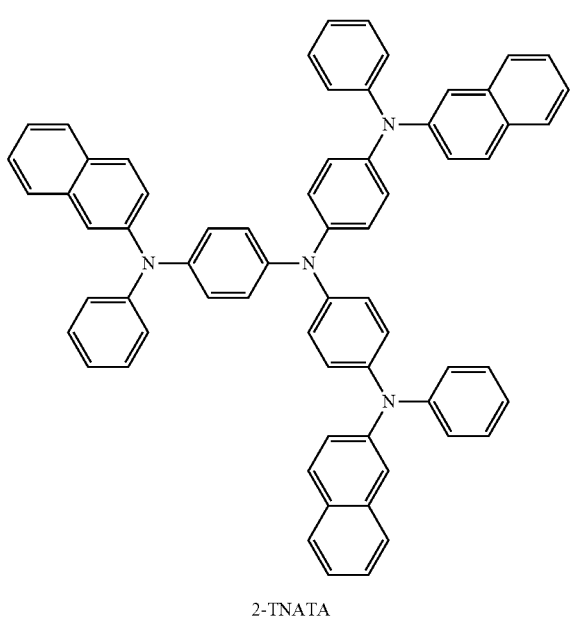
2-TNATA
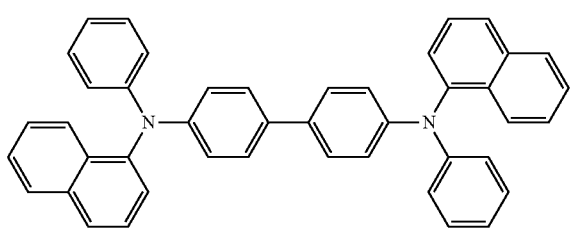
NPB
-continued
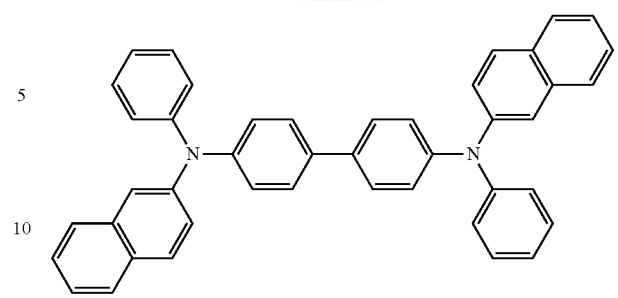
β-NPB -continued
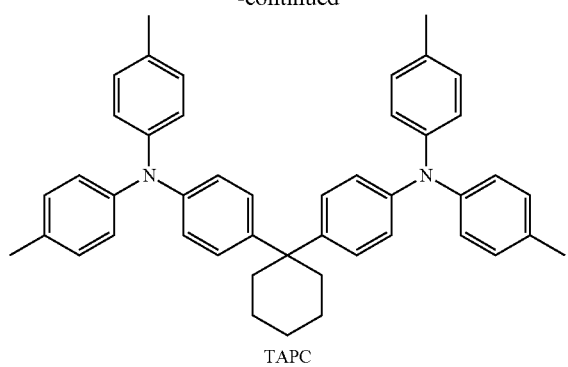
TAPC
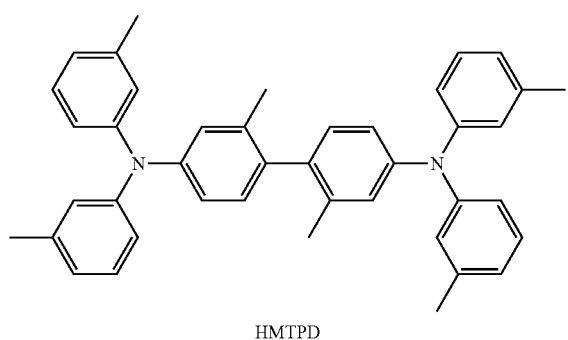
HMTPD
The hole blocking layer may include at least one of BCP and Bphen as follows, without being limited thereto.
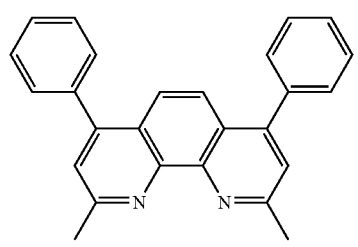
BCP
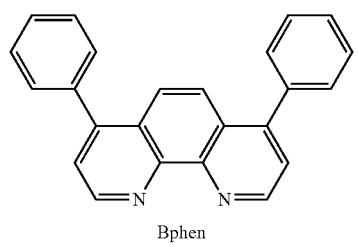
Bphen
The electron transport layer may include at least one of BCP and Bphen as above, and $Alq_3$, BAlq, TAZ, NTAZ, ET1, and ET2 as follows, without being limited thereto.
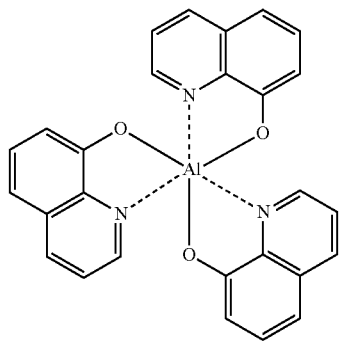
$Alq_3$
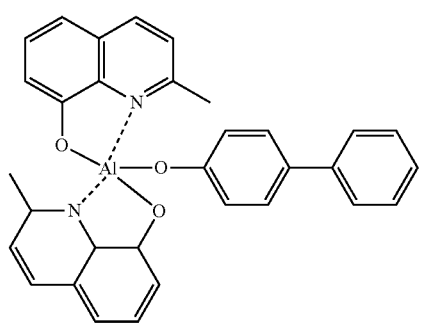
BAlq
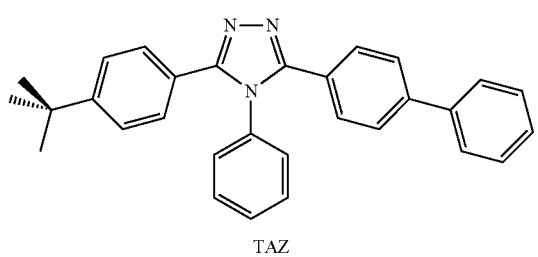
TAZ
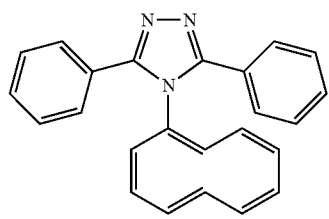
NTAZ

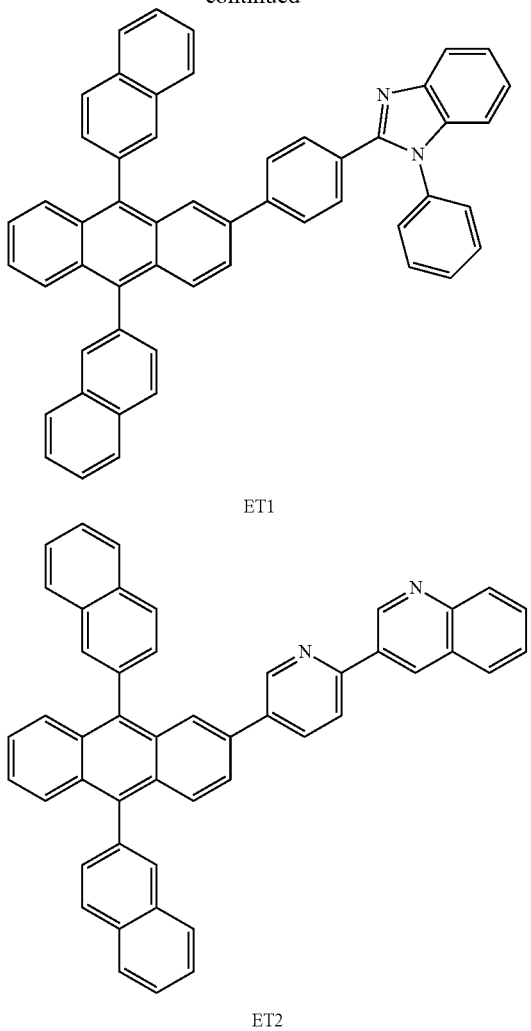

ET1

ET2

The electron injection layer may include at least one of LiF, NaCl, CsF, Li$_2$O, and BaO, without being limited thereto.

The encapsulation layer 130 may be directly formed on the organic light emitting element 120. The encapsulation layer 130 may encapsulate the organic light emitting element 120. As used herein, the expression "directly formed on" means that no adhesive layer, bonding layer and/or air layer is interposed between the encapsulation layer 130 and the organic light emitting element 120.

The encapsulation layer 130 may have a multilayer structure in which at least one inorganic layer and at least one organic layer are alternately stacked one above another. FIG. 2 shows an organic light emitting display device 100 including an encapsulation layer 130 in which two inorganic layers and one organic layer are alternately stacked in a total of three layers. Specifically, FIG. 2 shows an organic light emitting display device 100 including an encapsulation layer 130 in which a first inorganic layer 131, a first organic layer 132, and a second inorganic layer 133 are alternately stacked one above another. In other embodiments, the encapsulation layer may have other types of multilayer structure in which the inorganic layers and the organic layers are alternately stacked in a total of 5 to 15 layers, specifically 5 to 7 layers. For example, in the structure in which the encapsulation layer includes a total of 5 layers, the encapsulation layer may include a first inorganic layer, a first organic layer, a second inorganic layer, a second organic layer, and a third inorganic layer alternately stacked one above another. In the structure in which the encapsulation layer includes a total of 7 layers, the encapsulation layer may include a first inorganic layer, a first organic layer, a second inorganic layer, a second organic layer, a third inorganic layer, a third organic layer, and a fourth inorganic layer sequentially stacked. The inorganic layer or the organic layer of the encapsulation layer 130 is directly formed on the organic light emitting element 120 to encapsulate the organic light emitting element 120. The outermost layer of the encapsulation layer 130 may be an inorganic layer.

Hereinafter, an encapsulation layer 130 in which a first inorganic layer 131, a first organic layer 132, and a second inorganic layer 133 are sequentially stacked will be explained with reference to FIG. 2.

Components of the first inorganic layer 131 and the second inorganic layer 133 may be different from the component of the first organic layer 132, and may complement the effect of the first organic layer 132. The first inorganic layer 131 and the second inorganic layer 133 each may suppress permeation of moisture and/or oxygen into the organic light emitting element 120. The outermost layer of the encapsulation layer 130 with respect to the organic light emitting element 120 may be an inorganic layer that is the second inorganic layer 133.

The first inorganic layer 131 may be directly formed on the organic light emitting element 120, and may encapsulate the organic light emitting element 120. The first inorganic layer 131 may be additionally formed on the dam 140.

The first inorganic layer 131 may be formed in direct contact with the organic light emitting element 120 and the dam 140. The "formed in direct" means that no adhesive layer, bonding layer and/or air layer is interposed between the organic light emitting element 120 and the first inorganic layer 131, and between the dam 140 and the first inorganic layer 131. A portion the first inorganic layer 131 directly formed on the organic light emitting element 120 and a portion of the first inorganic layer 131 directly formed on the dam 140 are integrally formed. As used herein, the term "integrally formed" means that the corresponding portions are formed in one layer without being independently separated from each other. Thus, the first inorganic layer 131 may reduce permeation of external moisture and/or oxygen into the organic light emitting element 120.

The second inorganic layer 133 may be formed on the organic light emitting element 120 to encapsulate the organic light emitting element 120. The second inorganic layer 133 may be additionally formed on the dam 140.

The second inorganic layer 133 may be directly formed on the first organic layer 132. The first organic layer 132 may include a composition for encapsulating a display device according to embodiments of the invention. Thus, the second inorganic layer 133 may have low surface roughness and good flatness to implement a thin encapsulation layer 130.

The second inorganic layer 133 may be directly formed on the first inorganic layer 131 which is formed on the dam 140. Thus, the second inorganic layer 133 is integrally formed as the first inorganic layer 131 is integrally formed. The second inorganic layer 133 may further suppress permeation of external moisture and/or oxygen into the organic light emitting element 120, and may reduce slight lifting and/or delamination between the first inorganic layer 131 and the second inorganic layer 133. Therefore, the organic light emitting display device 100 according to the embodiment may have a structure in which the dam 140, the first inorganic layer 131, and the second inorganic layer 133 are sequentially formed on the substrate 110.

Figure 4:
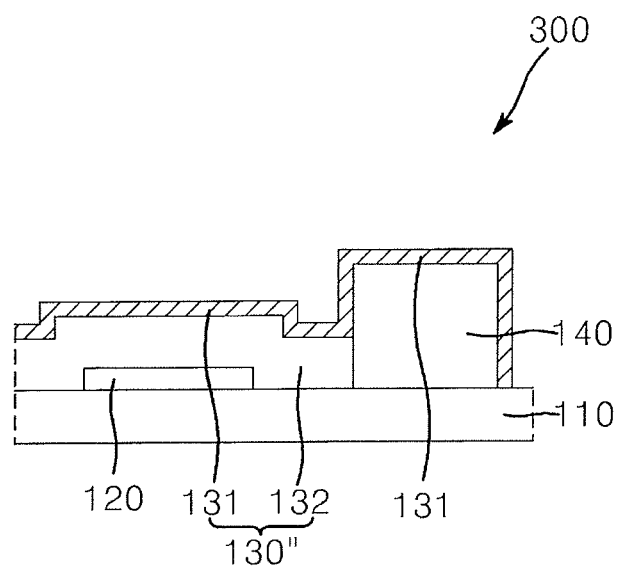
FIG. 4 is a partial cross-sectional view of an organic light emitting display device according to yet another embodiment of the invention.

In addition, as shown in FIG. 4, it is also possible to form a first organic layer 132 directly on an organic light emitting element 120 and then form a first inorganic layer 131 thereon, thereby implementing a thinner encapsulation layer 130".

Each of the first inorganic layer 131 and the second inorganic layer 133 may include an inorganic material having good light transmittance. The first inorganic layer 131 and the second inorganic layer 133 may be formed of the same or different inorganic materials. Specifically, the inorganic materials may include metals, nonmetals, intermetallic compounds or alloys, inter non-metallic compounds or alloys, oxides of metals or nonmetals, fluorides of metals or nonmetals, nitrides of metals or nonmetals, carbides of metals or nonmetals, oxynitrides of metals or nonmetals, borides of metals or nonmetals, oxyborides of metals or nonmetals, silicides of metals or nonmetals, and mixtures thereof. The metals or nonmetals may include silicon (Si), aluminum (Al), selenium (Se), zinc (Zn), antimony (Sb), indium (In), germanium (Ge), tin (Sn), bismuth (Bi), transition metals, and lanthanide metals, without being limited thereto. Specifically, the first inorganic layer and the second inorganic layer may each include silicon oxide (SiOx), silicon nitride (SiNx), silicon oxynitride (SiOxNy), ZnSe, ZnO, $Sb_2O_3$, AlOx including $Al_2O_3$, $In_2O_3$, or $SnO_2$. Here, each of x and y ranges from 1 to 5.

The first inorganic layer 131 and the second inorganic layer 133 may have the same or different thickness. For example, the first inorganic layer 131 and the second inorganic layer 133 each may have a thickness of about 40 nm to about 1,000 nm, specifically about 100 nm to about 1,000 nm. Within this range, the inorganic layer may prevent permeation of external moisture and/or oxygen.

The first organic layer 132 may be directly formed on the first inorganic layer 131 encapsulating the organic light emitting element 120, and may be formed between the first inorganic layer 131 and the second inorganic layer 133. The first organic layer 132 may encapsulate the organic light emitting element 120 to suppress permeation of external moisture and/or oxygen into the organic light emitting element 120. Also, the first organic layer 132 has a low plasma etch rate and low surface roughness, which enables to form a second inorganic layer 133 in a constant thickness.

The first organic layer 132 may have a thickness of about 0.2 μm to about 15 μm, for example about 1 μm to about 15 μM. Within this range, the organic layer may flatten an inorganic layer and prevent defects of the inorganic layer, thereby preventing permeation of external moisture and oxygen.

The first organic layer 132 may include a composition for encapsulating a display device according to embodiments of the invention.

Hereinafter, a composition for encapsulating a display device according to embodiments of the invention will be described.

The composition for encapsulating a display device according to an embodiment of the invention may include a photocurable monomer and a photopolymerization initiator.

The photocurable monomer may mean a photocurable monomer which may undergo a curing reaction by the photopolymerization initiator. A non-silicon based monomer which does not include silicon (Si) may be used as the photocurable monomer. For example, the photocurable monomer may be a monomer formed only of at least one element selected from the group consisting of C, H, O, N or S, without being limited thereto. The photocurable monomer may be synthesized by conventional synthetic methods, or a commercial product may be used.

The photocurable monomer may include a monomer without an aromatic hydrocarbon (non-aromatic hydrocarbon based monomer); and a monomer of following Formula 1 including substituted or non-substituted at least two phenyl groups, and the photocurable monomer may include about 5 wt % to about 45 wt % of the monomer including substituted or non-substituted at least two phenyl groups and about 55 wt % to about 95 wt % of the monomer without an aromatic hydrocarbon:

[Formula 1]

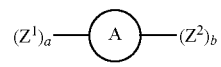

wherein in Formula 1, A is a hydrocarbon including substituted or non-substituted at least two phenyl groups, or a hetero atom-containing hydrocarbon including substituted or non-substituted at least two phenyl groups, $Z^1$ and $Z^2$ are each independently a compound of following Formula 2, a and b are each independently an integer of 0 to 2, and a+b is an integer of 1 to 4:

[Formula 2]

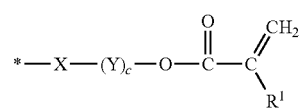

wherein in Formula 2, * is a portion connected to a carbon atom of A in Formula 1, X is a single bond, O or S, Y is a substituted or non-substituted straight chain alkylene group having 1 to 10 carbon atoms, or a substituted or non-substituted alkoxylene group having 1 to 20 carbon atoms, $R^1$ is hydrogen or an alkyl group having 1 to 5 carbon atoms, and c is 0 or 1.

In Formula 2, the term "single bond" means that A of Formula 1 is directly connected to (Y)c without any interposing element therebetween.

In the above Formula 1, A is a hydrocarbon including substituted or non-substituted at least two phenyl groups, or a hetero atom-containing hydrocarbon including substituted or non-substituted at least two phenyl groups. The hydrocarbon including substituted or non-substituted at least two phenyl groups, or the hetero atom-containing hydrocarbon including substituted or non-substituted at least two phenyl groups may mean that the substituted or non-substituted at least two phenyl groups are not condensed and are bonded to a single bond, an oxygen atom, a sulfur atom, a substituted or non-substituted alkylene group having 1 to 5 carbon atoms, a hetero atom-substituted or non-substituted alkylene group having 3 to 6 carbon atoms, an ethenylene group, an ethynylene group, or a carbonyl group. Examples of the hydrocarbon including substituted or non-substituted at least two phenyl groups, or the hydrocarbon including a substituted or non-substituted hetero atom including at least two phenyl groups may include a substituted or non-substituted biphenyl group, a substituted or non-substituted triphenylmethyl group, a substituted or non-substituted terphenyl group, a substituted or non-substituted biphenylene group, a substituted or non-substituted terphenylene group, a substituted or non-substituted quarterphenylene group, a substituted or non-substituted 2-phenyl-2-(phenylthio)ethyl group, a substituted or non-substituted 2,2-diphenylpropane group, a substituted or non-substituted diphenylmethane group, a substituted or non-substituted cumylphenyl group, a substituted or non-substituted bisphenol F group, a substituted or non-substituted bisphenol A group, a substituted or non-substituted biphenyloxy group, a substituted or non-substituted terphenyloxy group, a substituted or non-substituted quarterphenyloxy group, a substituted or non-substituted quinquephenyloxy group, and structural isomers thereof, without being limited thereto.

The monomer including substituted or non-substituted at least two phenyl groups may include mono(meth)acrylate, di(meth)acrylate, or mixtures thereof. Examples of the monomer including substituted or non-substituted at least two phenyl groups may include 4-(meth)acryloxy-2-hydroxybenzophenone, ethyl-3,3-diphenyl(meth) acrylate, benzoyloxyphenyl(meth)acrylate, bisphenol A di(meth)acrylate, ethoxylated bisphenol A di(meth)acrylate, bisphenol F di(meth)acrylate, ethoxylated bisphenol F di(meth)acrylate, 4-cumylphenoxyethyl(meth)acrylate, ethoxylated bisphenylfluorenedi(meth)acrylate, 2-phenylphenoxyethyl (meth)acrylate, 2,2'-phenylphenoxyethyldi(meth)acrylate, 2-phenylphenoxypropyl(meth)acrylate, 2,2'-phenylphenoxypropyldi(meth)acrylate, 2-phenylphenoxybutyl(meth) acrylate, 2,2'-phenylphenoxybutyldi(meth)acrylate, 2-(3-phenylphenyl)ethyl(meth)acrylate, 2-(4-benzylphenyl)ethyl (meth)acrylate, 2-phenyl-2-(phenylthio)ethyl(meth) acrylate, 2-(triphenylmethyloxy)ethyl(meth)acrylate, 4-(triphenylmethyloxy)butyl(meth)acrylate, 3-(biphenyl-2-yloxy)butyl(meth)acrylate, 2-(biphenyl-2-yloxy)butyl (meth)acrylate, 4-(biphenyl-2-yloxy)propyl(meth)acrylate, 3-(biphenyl-2-yloxy)propyl(meth)acrylate, 2-(biphenyl-2-yloxy)propyl (meth)acrylate, 4-(biphenyl-2-yloxy)ethyl (meth)acrylate, 3-(biphenyl-2-yloxy)ethyl (meth)acrylate, 2-(4-benzylphenyl)ethyl(meth)acrylate, 4,4'-di((meth) acryloyloxymethyl)biphenyl, 2,2'-di(2-(meth)acryloyloxyethoxy)biphenyl, structural isomers thereof, or mixtures thereof, without being limited thereto. In addition, (meth) acrylate mentioned in the invention is an example without being limited to only those in the example, and the invention also includes acrylates which are structural isomers of (meth)acrylate. For example, although 2,2'-phenylphenoxyethyldi(meth)acrylate is mentioned as an example, the invention may also include 3,2'-phenylphenoxyethyldi (meth)acrylate, 3,3'-phenylphenoxyethyldi(meth)acrylate and the like, which are structural isomers of 2,2'-phenylphenoxyethyldi(meth)acrylate.

In some embodiments, the monomer including substituted or non-substituted at least two phenyl groups may include mono(meth)acrylate represented by following Formula 3:

[Formula 3]

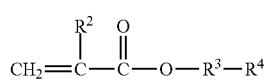

wherein in Formula 3, $R^2$ is hydrogen or a methyl group, $R^3$ is a substituted or non-substituted straight chain alkylene group having 1 to 10 carbon atoms, or a substituted or non-substituted alkoxylene group having 1 to 20 carbon atoms, and $R^4$ is a hydrocarbon including substituted or non-substituted at least two phenyl groups, or a hetero atom-containing hydrocarbon including substituted or non-substituted at least two phenyl groups.

For example, the hydrocarbon including substituted or non-substituted at least two phenyl groups, or the hetero atom-containing hydrocarbon including substituted or non-substituted at least two phenyl groups may mean that the substituted or non-substituted at least two phenyl groups are not condensed and are bonded to a single bond, an oxygen atom, a sulfur atom, a substituted or non-substituted alkylene group having 1 to 3 carbon atoms, a hetero atom-substituted or non-substituted alkylene group having 3 to 6 carbon atoms, an ethenylene group, an ethynylene group, or a carbonyl group. Examples of the hydrocarbon including substituted or non-substituted at least two phenyl groups, or the hetero-atom containing hydrocarbon including substituted or non-substituted at least two phenyl groups may include a substituted or non-substituted biphenyl group, a substituted or non-substituted triphenylmethyl group, a substituted or non-substituted terphenyl group, a substituted or non-substituted biphenylene group, a substituted or non-substituted terphenylene group, a substituted or non-substituted quarterphenylene group, a substituted or non-substituted 2-phenyl-2-(phenylthio)ethylene group, a substituted or non-substituted 2,2-diphenylpropane group, a substituted or non-substituted diphenylmethane group, a substituted or non-substituted cumylphenyl group, a substituted or non-substituted bisphenol F group, a substituted or non-substituted bisphenol A group, a substituted or non-substituted biphenyloxy group, a substituted or non-substituted terphenyloxy group, a substituted or non-substituted quarterphenyloxy group, a substituted or non-substituted quinquephenyloxy group, and the like, without being limited thereto.

In some embodiments, the monomer including substituted or non-substituted at least two phenyl groups may include di(meth)acrylate represented by following Formula 4:

[Formula 4]

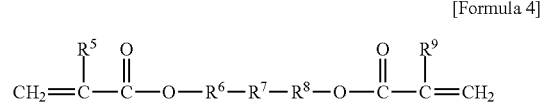

wherein in Formula 4, $R^5$ and $R^9$ are each independently hydrogen or a methyl group, $R^6$ and $R^8$ are each independently a substituted or non-substituted straight chain alkylene group having 1 to 10 carbon atoms, or a substituted or non-substituted alkoxylene group having 1 to 20 carbon atoms, and $R^7$ is a hydrocarbon including substituted or non-substituted at least two phenyl groups, or a hetero atom-containing hydrocarbon including substituted or non-substituted at least two phenyl groups.

For example, the hydrocarbon including substituted or non-substituted at least two phenyl groups, or the hetero atom-containing hydrocarbon including substituted or non-substituted at least two phenyl groups may mean that the substituted or non-substituted at least two phenyl groups are not condensed and are bonded to a single bond, an oxygen atom, a sulfur atom, a substituted or non-substituted alkylene group having 1 to 4 carbon atoms, a hetero atom-substituted or non-substituted alkylene group having 3 to 6 carbon atoms, an ethenylene group, an ethynylene group, or a carbonyl group. Examples of the hydrocarbon including substituted or non-substituted at least two phenyl groups, or the hetero atom-containing hydrocarbon including substituted or non-substituted at least two phenyl groups may include a substituted or non-substituted biphenylene group, a substituted or non-substituted triphenylmethylene group, a substituted or non-substituted terphenylene group, a substituted or non-substituted quarterphenylene group, a 2-phenyl-2-(phenylthio)ethylene group, a 2,2-diphenylpropylene group, a diphenylmethylene group, and the like, without being limited thereto.

In Formula 1, a and b are each independently an integer of 0 to 2, and a+b is an integer of 1 to 4. In some embodiments, a+b is 1 or 2.

The monomer including substituted or non-substituted at least two phenyl groups may have a molecular weight of about 100 g/mol to about 1,000 g/mol, about 130 g/mol to about 700 g/mol, about 150 g/mol to about 600 g/mol. Within this range, an organic layer having good plasma resistance, low surface roughness, and excellent transmittance may be provided.

The monomer including substituted or non-substituted at least two phenyl groups may be present in an amount of about 5 wt % to about 45 wt %, for example about 10 wt % to about 40 wt %, based on a total weight of the photocurable monomer. Within this range, an organic layer having a suitable viscosity for forming an organic layer and good plasma resistance may be produced.

The monomer without an aromatic hydrocarbon group does not include an aromatic hydrocarbon, and may include a monomer having about 1 to about 20, for example about 1 to about 6 photocurable functional groups at least one selected from a vinyl group, an acrylate group, and a methacrylate. The non-aromatic hydrocarbon based monomer may include about 1 to about 3, for example about 1 to about 2, about 1, or about 2 photocurable functional group.

The monomer without an aromatic hydrocarbon may have a molecular weight of about 100 g/mol to about 500 g/mol, about 130 g/mol to about 400 g/mol. Within this range, more advantageous effects in terms of processability may be exhibited.

The monomer without an aromatic hydrocarbon may include a monofunctional monomer with a photocurable functional group, a polyfunctional monomer with a photocurable functional group, or mixtures thereof.

The monomer without an aromatic hydrocarbon group may include a (meth) acrylate monomer. Examples of the non-aromatic hydrocarbon based monomer may include unsaturated carboxylic acid ester including an alkyl group having 1 to 20 carbon atoms, a cycloalkyl group having 3 to 20 carbon atoms, a hydroxyl group, and an alkyl group having 1 to 20 carbon atoms; unsaturated carboxylic acid ester including an aminoalkyl group having 1 to 20 carbon atoms; vinyl ester of saturated or unsaturated carboxylic acid having 1 to 20 carbon atoms; a vinyl cyanide compound; an unsaturated amide compound; monofunctional or multifunctional (meth) acrylate of monohydric or polyhydric alcohol and the like. The term "polyhydric alcohol" may mean an alcohol including at least two, for example about 2 to about 20, specifically about 2 to about 10, more specifically about 2 to about 6 hydroxyl groups.

In some embodiments, examples of the (meth) acrylate monomer without an aromatic hydrocarbon may include mono(meth)acrylate, di(meth)acrylate, tri(meth)acrylate, tetra(meth)acrylate and the like including a substituted or non-substituted $C_1$ to $C_{20}$ alkyl group, a substituted or non-substituted $C_1$ to $C_{20}$ alkylsilyl group, a substituted or non-substituted $C_3$ to $C_{20}$ cycloalkyl group, a substituted or non-substituted $C_1$ to $C_{20}$ alkylene group, an amine group, an ethylene oxide group.

Examples of the (meth) acrylate monomer without an aromatic hydrocarbon group may include unsaturated carboxylic acid ester including (meth) acrylic acid ester such as methyl (meth)acrylate, ethyl (meth)acrylate, butyl (meth)acrylate, 2-hydroxyethyl (meth)acrylate, 2-hydroxybutyl (meth)acrylate, hexyl (meth)acrylate, octyl (meth)acrylate, nonyl (meth)acrylate, decanyl (meth)acrylate, undecanyl (meth)acrylate, dodecyl (meth)acrylate, cyclohexyl (meth)acrylate and the like; unsaturated carboxylic acid aminoalkyl ester such as 2-aminoethyl (meth)acrylate, 2-dimethylaminoethyl (meth)acrylate and the like; saturated or unsaturated carboxylic acid vinyl ester such as vinyl acetate and the like; a vinyl cyanide compound such as (meth)acrylonitrile; an unsaturated amide compound such as (meth)acrylamide; ethylene glycol di(meth)acrylate, triethylene glycol di(meth)acrylate, trimethylolpropane tri(meth)acrylate, 1,4-butanediol di(meth)acrylate, 1,6-hexanediol di(meth)acrylate, octanediol di(meth)acrylate, nonanediol di(meth)acrylate, decanediol di(meth)acrylate, undecanediol di(meth)acrylate, dodecanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, or mixtures thereof, without being limited thereto.

In some embodiments, the monomer without an aromatic hydrocarbon may be a non-aromatic based compound which does not include an aromatic group, and examples of the monomer without an aromatic hydrocarbon may include at least one of mono(meth)acrylate including a substituted or non-substituted alkyl group having 1 to 20 carbon groups, mono(meth)acrylate including an amine group, di(meth)acrylate including a substituted or non-substituted alkylene group having 1 to 20 carbon groups, di(meth)acrylate including an ethylene oxide group, tri(meth)acrylate including an ethylene oxide group, or trimethylolpropane tri(meth)acrylate.

Examples of the mono(meth)acrylate compound including a substituted or non-substituted alkyl group having 1 to 20 carbon atoms may include decyl(meth)acrylate, undecyl (meth)acrylate, lauryl(meth)acrylate, tridecyl(meth)acrylate, tetradecyl(meth)acrylate, pentadecyl(meth)acrylate, hexadecyl(meth)acrylate, heptadecyl(meth)acrylate, octadecyl(meth)acrylate, nonadecyl(meth)acrylate, arachidyl (meth)acrylate, or mixtures thereof, without being limited thereto.

Examples of the mono(meth)acrylate compound including an amine group may include 2-aminoethyl(meth)acrylate, 2-dimethylaminoethyl(meth)acrylate, or mixtures thereof, without being limited thereto.

Examples of the di(meth)acrylate compound including a substituted or non-substituted alkylene group having 1 to 20 carbon atoms may include di(meth)acrylate including an alkylene group having 1 to 20 carbon atoms, non-silicon based di(meth)acrylate including a substituted or non-substituted long chain alkylene group. When the non-silicon based di(meth)acrylate including a long chain alkylene group is included in the composition, the composition for encapsulation may easily form an organic layer on an organic light emitting element, or on an inorganic layer encapsulating an organic light emitting element. Examples of di(meth)acrylate including a substituted or non-substituted alkylene group having 1 to 20 carbon atoms may include octanediol di(meth)acrylate, nonanediol di(meth)acrylate, decanediol di(meth)acrylate, undecanediol di(meth)acrylate, dodecanediol di(meth)acrylate, or mixtures thereof, without being limited thereto. When di(meth)acrylate including a substituted or non-substituted alkylene group having 1 to 20 carbon atoms is included in the composition, the composition for encapsulation may have lower photo curing rate and low viscosity.

Examples of the di(meth)acrylate compound including an ethylene oxide group or tri(meth)acrylate including an ethylene oxide group may include ethylene glycol di(meth)acrylate, triethylene glycol di(meth)acrylate, or mixtures thereof, without being limited thereto.

The monomer without an aromatic hydrocarbon may be present in an amount of about 55 wt % to about 95 wt %, for example about 60 wt % to about 90 wt %, based on a total weight of the photocurable monomer. Within this range, the composition for encapsulating a display device may have a suitable viscosity for forming an organic layer.

The photocurable monomer includes a monomer without an aromatic hydrocarbon (a non-aromatic hydrocarbon-based monomer) and a monomer including substituted or non-substituted at least two phenyl group of Formula 1 above, and the photocurable monomer may be present in an amount of about 80 to about 99.9 parts by weight in the composition for encapsulating a display device, based on 100 parts by weight of a total weight of the photocurable monomer and the photopolymerization initiator. Within this range, the effect of the invention may be implemented. For example, the photocurable monomer may be present in an amount of about 90 to about 99.5 parts by weight, specifically about 92 to about 99 parts by weight.

The photopolymerization initiator may cure the monomer without an aromatic hydrocarbon and the monomer including substituted or non-substituted at least two phenyl groups.

The photopolymerization initiator may include a typical photopolymerization initiator which may carry out a photopolymerization reaction, without limitation. For example, the photopolymerization initiator may include a triazine initiator, an acetophenone initiator, a benzophenone initiator, a thioxanthone initiator, a benzoin initiator, a phosphorus initiator, an oxime initiator, or mixtures thereof.

Examples of the triazine initiator may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphto-1-yl)-4,6-bis(trichloromethyl)-s-triazine, 2,4-trichloromethyl(piperonyl)-6-triazine, 2,4-trichloromethyl(4'-methoxystyryl)-6-triazine, or mixtures thereof.

Examples of the acetophenone initiator may include 2,2'-diethoxyacetophenone, 2,2'-dibutoxyacetophenone, 2-hydroxy-2-methylpropiophenone, p-t-butyl trichloroacetophenone, p-t-butyl dichloroacetophenone, 4-chloroacetophenone, 2,2'-dichloro-4-phenoxyacetophenone, 2-methyl-1-(4-(methylthio)phenyl)-2-morpholinopropan-1-one 2-benzyl-2-dimethylamino-1-(4-morpholinophenyl)-butan-1-one, or mixtures thereof.

Examples of the benzophenone initiator may include benzophenone, benzoyl benzoic acid, methyl benzoyl benzoate, 4-phenyl benzophenone, hydroxy benzophenone, acrylated benzophenone, 4,4'-bis(dimethylamino)benzophenone, 4,4'-dichloro benzophenone, 3,3'-dimethyl-2-methoxy benzophenone, or mixtures thereof.

Examples of the thioxanthone initiator may include thioxanthone, 2-methyl thioxanthone, isopropyl thioxanthone, 2,4-diethyl thioxanthone, 2,4-diisopropyl thioxanthone, 2-chlorothioxanthone, or mixtures thereof.

Examples of the benzoin initiator may include benzoin, benzoin methyl ether, benzoin ethyl ether, benzoin isopropyl ether, benzoin isobutyl ether, benzyl dimethyl ketal, or mixtures thereof.

Examples of the phosphorus initiator may include bisbenzoylphenyl phosphine oxide, trimethylbenzoyldiphenyl phosphine oxide, or mixtures thereof.

Examples of the oxime initiator may include 2-(o-benzoyloxime)-1-[4-(phenylthio)phenyl]-1,2-octanedione, 1-(o-acetyloxime)-1-[9-ethyl-6-(2-methylbenzoyl)-9H-carbazole-3-yl]ethanone, or mixtures thereof.

It is also possible to use a photo acid generator or a photopolymerization initiator such as carbazole, diketone, sulfonium, iodonium, diazo, biimidazole based compounds in place of the above mentioned photopolymerization initiator.

The photopolymerization initiator may be present in an amount of about 0.1 to about 20 parts by weight in the composition for encapsulating a display device, based on 100 parts by weight of a total weight of the photocurable monomer and the photopolymerization initiator. Within this range, a photopolymerization reaction may take place sufficiently when exposed to a light, and transmittance deterioration caused by an unreacted initiator after the photopolymerization reaction may be prevented. In an implementation, the photopolymerization initiator may be present in an amount of about 0.5 to about 10 parts by weight, for example about 1 to about 8 parts by weight. In addition, the photopolymerization initiator may be present in an amount of about 0.1 wt % to about 10 wt %, for example about 0.1 wt % to about 8 wt % in the composition for encapsulating a display device. Within this range, a photo polymerization reaction may take place sufficiently, and transmittance deterioration caused by an unreacted initiator may be prevented.

A composition for encapsulating a display device according to another embodiment of the invention may include a photocurable monomer, a photo polymerization initiator, and an antioxidant. This composition is substantially the same with the above explained composition for encapsulating a display device according to an embodiment of the invention except for further including an antioxidant.

An antioxidant may improve thermal stability of the encapsulation layer. The antioxidant may include at least one selected from the group consisting of phenol, quinone, amine, and phosphite, without being limited thereto. For example, the antioxidant may include tetrakis[methylene(3,5-di-t-butyl-4-hydroxyhydrocinnamate)]methane, tris(2,4-di-tert-butylphenyl)phosphite and the like.

The antioxidant may be present in an amount of about 0.01 to about 3 parts by weight, for example about 0.01 to about 1 parts by weight in the composition for encapsulating a display device, based on 100 parts by weight of a total weight of the photocurable monomer and the photopolymerization initiator. Within this range, the organic layer may exhibit excellent thermal stability.

A composition for encapsulating a display device according to yet another embodiment of the invention may include a photocurable monomer, a photo polymerization initiator, and a heat stabilizer. This composition is substantially the same with the above explained composition for encapsulating a display device according to an embodiment of the invention except for except for further including a heat stabilizer. By including the heat stabilizer, a viscosity change of the composition for encapsulating a display device according to yet another embodiment of the invention may be suppressed at room temperature. Further, it is possible to increase a light transmission rate and a photocuring rate, and to lower a plasma etch rate, as compared with a composition for encapsulation without a heat stabilizer. Since this composition is substantially the same with the composition for encapsulating a display device according to an embodiment of the invention except for further including a heat stabilizer, only the heat stabilizer will be explained below.

The heat stabilizer may inhibit a viscosity change of a composition for encapsulation at room temperature, and a conventional heat stabilizer may be used without limitation. For example, a sterically hindered phenolic heat stabilizer may be used. Specifically, the heat stabilizer may include at least one of poly(dicyclopentadiene-co-p-cresol), octadecyl-3-(3,5-di-tert-butyl-4-hydroxyphenyl)propionate, 2,6-di-tert-butyl-4-methylphenol, 2,2'-metano-bi(4-methyl-6-tert-butyl-phenol), 6,6'-di-tert-butyl-2,2'-thiodi-p-cresol, tris(4-tert-butyl-3-hydroxy-2,6-dimethylbenzyl)isocyanurate, triethylene glycol-bis(3-tert-butyl-4-hydroxy-5-methylphenyl), 4,4'-thiobis(6-tert-butyl-m-cresol), 3,3'-bis(3,5-di-tert-butyl-4-hydroxyphenyl)-N,N'-hexamethylene-dipropionamide, pentaerythritol tetrakis(3-(3,5-di-tert-butyl-4-hydroxyphenyl)propionate), stearyl-3,5-di-tert-butyl-4-hydroxyphenylpropionate, pentaerythritoltetrakis 1,3,5-tris (2,6-di-methyl-3-hydroxy-4-tert-butyl-benzyl)isocyanurate, 1,3,5-tris(3,5-di-tert-butyl-4-hydroxybenzyl)isocyanurate, 1,3,5-tris(2-hydroxyethyl)isocyanurate-tris(3,5-di-tert-butylhydroxyphenylpropionate), without being limited thereto.

The heat stabilizer may be present in an amount about of 2,000 ppm or less, for example about 0.01 ppm to about 2,000 ppm, specifically about 100 ppm to about 1,000 ppm in the composition for encapsulating a display device, based on the total amount of the photocurable monomer and the photopolymerization initiator, in terms of solid contents. Within this range, the heat stabilizer may further improve storage reliability and processability of the encapsulating composition in a liquid state.

The composition for encapsulating a display device according to the embodiments of the invention may be cured by ultraviolet ray irradiation at about 10 mW/cm$^2$ to about 500 mW/cm$^2$ for about 1 second to about 100 seconds, without being limited thereto.

The composition for encapsulating a display device according to the embodiments of the invention may implement an organic layer having a plasma etch rate of about 400 nm/min or less as represented by following Equation 1, and a surface roughness of about 2 nm or less:

$$\text{Plasma etch rate (nm/min)} = (T0 - T1)/M \quad \text{[Equation 1]}$$

in Equation 1, T0 is a thickness (unit: nm) of a sample prepared by applying the composition for encapsulating a display device onto a substrate by spray, followed by being subjected to ultraviolet ray irradiation at 100 mW/cm$^2$ for 10 seconds and curing the composition, T1 is a thickness (unit: nm) of the above prepared sample after being subjected to a plasma treatment for 1 minute under the condition of ICP power 2500 W, RF power 300 W, DC bias 200V, argon (Ar) flow rate 50 sccm, pressure 10 mtorr, T0 and T1 each represents a thickness excluding the substrate, and M is a plasma treatment time (unit: min).

Within this range, when an organic layer is formed on an organic light emitting element, or on an inorganic layer formed on an organic light emitting element, a plasma etch rate which represents a damage to the organic layer during the plasma treatment is greatly reduced and an organic layer having high plasma resistance may be provided. In some embodiments, the plasma etch rate may be about 400 nm/min or less, for example about 10 to about 390 nm/min, specifically about 10 to about 385 nm/min. When the plasma etch rate represented by above Equation 1 is more than about 400 nm/min, damages to the organic layer may increase to deteriorate reliability of an organic light emitting element.

A surface roughness is roughness of a deposited surface measured from a surface profile after the composition for encapsulating a display device is deposited on a substrate. Lower surface roughness may contribute to flatten a surface of a display device.

The surface roughness of the invention may be measured by general roughness measuring methods known to those skilled in the art. For example, Atomic Force Microscope (AFM) may be used. In some embodiments, surface roughness (roughness of a deposited surface) may be about 2 nm or less, for example about 0 nm to about 2 nm, about 0 nm to about 1.9 nm, about 0 nm to about 1.85 nm, when measured by Atomic Force Microscope. When the surface roughness is 2 nm or less, an organic layer with a flat surface may be provided, and an inorganic protective layer that is formed after deposition of the organic layer may be deposited in a flat contour. When the surface roughness is more than about 2 nm, an organic layer is not flattened, and an inorganic layer deposited on the surface of the organic layer may be broken.

The composition for encapsulating a display device according to the embodiments of the invention may produce an organic layer having an outgassing amount of about 2,000 ppm or less. Within this range, durability of a member for a device may be elongated to increase reliability. Specifically, the outgassing amount may be about 10 ppm to about 1,000 ppm.

The outgassing amount may be measured by a conventional method. For example, a sample having a thickness of 5 μm is prepared by applying a composition for encapsulating a display device onto a glass substrate, followed by being subjected to ultraviolet ray irradiation at 100 mW/cm$^2$ for 10 seconds, and curing the composition. For the specimen having a thickness of 5 μm, an outgassing amount captured by heating is measured using an equipment TD-GC/MS (TD: JTD505III, GC/MS: Clarus 600, Perkin Elmer Inc.) for a predetermined surface area (1×5 cm$^2$) at a temperature range of 40° C. to 320° C. at an elevation rate of 10° C./min.

The composition for encapsulating a display device according to the embodiments of the invention may produce an organic layer having a color coordinate value YI of about 0.5 or less (in accordance with ASTM D1925) when measured after being cured. Within this range, the encapsulating material for a display device is transparent and transmits a light close to a white light, which enables its application to a display device. Specifically, the organic layer may have a color coordinate value YI of about 0.1 to about 0.5.

The color coordinate value can be measured by a conventional method. For example, a sample having a thickness of 5 μm is prepared by applying the composition for encapsulating a display device onto a glass substrate, followed by being subjected to ultraviolet ray irradiation at 100 mW/cm$^2$ for 10 seconds, and curing the composition. For the specimen having a thickness of 5 μm, transmittance of a light having a wavelength 300 nm to 800 nm is measured using a UV-visible spectrophotometer (UV-2450, SHIMADZU Corporation), and a color coordinate value YI is calculated therefrom (ASTM D1925).

The composition for encapsulating a display device according to the embodiments has a high total light transmittance of about 90% to about 100%, specifically about 95% to about 100%, and may provide a transparent organic protection layer. The total light transmittance and haze are measured using a hazemeter (NDH-5000, Nippon Denshoku Industries Co., Ltd.) at a wavelength of 400 nm to 700 nm in accordance with ASTM D1003-95.

The composition for encapsulating a display device according to the embodiments of the invention is used for applying onto a front face of a light emitting device and needs to be transparent without exhibiting a color. When the material for encapsulating a display device exhibits a color, the color coordinate of the light emitted from a light source of a display device may be shifted after the light is transmitted through the encapsulation material in the front face to distort colors. In addition, as the transparency is lowered, the efficiency of the light emitted from a front face of the display device is lowered, and the display device may not be clearly visible.

The dam 140 may be formed on the non-light emitting area of the substrate 110, and may separate the light emitting area from the non-light emitting area. The dam 140 is thicker than the organic light emitting element 120. Thus, the dam 140 may protect the organic light emitting element 120 from external moisture and/or oxygen, imparting a lateral encapsulating function on the organic light emitting display device, preventing the organic layer from being exposed to the outside. In addition, the dam 140 may prevent the composition for encapsulating a display device from spreading into outside of the light emitting area or the substrate during formation of an organic layer. The dam 140 may also prevent the edge of the encapsulation layer from being thickened.

The dam 140 may block external moisture and/or oxygen, and may include an optically transparent material. Specifically, the dam 140 may include at least one material which is included in the above described hole transporting region, the electron transporting region, and the light emitting layer, without being limited thereto. The dam 140 may be formed with the above material in one layer, or by stacking a plurality of layers.

Although not shown in FIG. 1 and FIG. 2, the organic light emitting display device 100 may include a driving circuit portion for driving the organic light emitting element 120. In addition, although not shown in FIG. 1 and FIG. 2, a TFT (thin film transistor) layer and a buffer layer may be formed between the substrate 110 and the organic light emitting element 120 in the organic light emitting display device 100. The TFT layer may drive the organic light emitting element 120, and may include a gate line, a data line, a driving power supply line, a reference power source line and a capacitor. Further, although not shown in FIG. 1 and FIG. 2, the organic light emitting display device 100 may further include an adhesive layer covering the encapsulation layer and the dam, and a substrate adhered to the adhesive layer and encapsulating the organic light emitting element. The adhesive layer may be a transparent adhesive film. A material for the adhesive layer and the substrate may include a conventional material known to those skilled in the art.

Hereinafter, an organic light emitting display device according to yet another embodiment of the invention will be explained with reference to FIG. 3.

Figure 3:
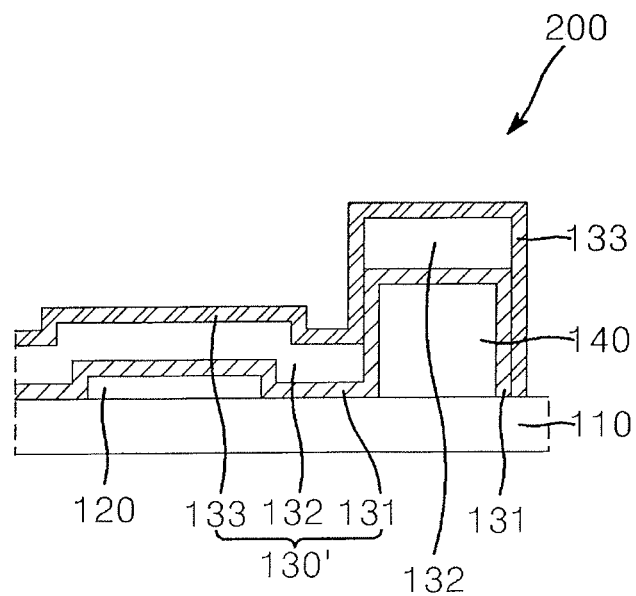
FIG. 3 is a partial cross-sectional view of an organic light emitting display device according to another embodiment of the invention.

Referring to FIG. 3, an organic light emitting display device 200 according to the embodiment may include a substrate 110, an organic light emitting element 120, an encapsulation layer 130', and a dam 140. Except that an encapsulation layer 130' is formed instead of the encapsulation layer 130, the organic light emitting display device 200 is substantially the same with the above explained organic light emitting display device according to an embodiment of the invention. Thus, only the encapsulation layer 130' will be explained hereinafter.

The encapsulation layer 130' may include a first inorganic layer 131, a first organic layer 132, and a second inorganic layer 133. The encapsulation layer 130' may encapsulate the organic light emitting element 120. The encapsulation layer 130' is additionally formed on the dam 140. Therefore, the organic light emitting display device 200 may have a structure in which the dam 140, the first inorganic layer 131, the first organic layer 132, and the second inorganic layer 133 are sequentially stacked on the substrate 110. Therefore, the organic light emitting display device 200 may be protected from external moisture and/or oxygen permeation.

The first organic layer 132 is not formed continuously, and is separated by the dam 140 in the light emitting area and the non-light emitting area. Thus, the organic layer is not directly exposed to the outside, and external moisture and/or oxygen permeation may be suppressed.

Hereinafter, an organic light emitting display device according to yet another embodiment of the invention will be described with reference to FIG. 4. FIG. 4 is a partial cross-sectional view of an organic light emitting display device according to yet another embodiment of the invention.

Referring to FIG. 4, an organic light emitting display device 300 according to the embodiment may include a substrate 110, an organic light emitting element 120, an encapsulation layer 130", and a dam 140. Except that an encapsulation layer 130" is formed instead of the encapsulation layer 130, the organic light emitting display device 300 is substantially the same with the above explained organic light emitting display device according to an embodiment of the invention. Thus, only the encapsulation layer 130" will be explained hereinafter.

The encapsulation layer 130" may include a first inorganic layer 131 and a first organic layer 132.

The first organic layer 132 is directly formed on the organic light emitting element 120.

The first inorganic layer 131 is directly formed on the first organic layer 132 and the dam 140. Therefore, the organic light emitting display device 300 according to the embodiment may have a structure in which the dam 140 and the first inorganic layer 131 are sequentially stacked on the substrate 110.

A portion of the first inorganic layer 131 directly formed on the first organic layer 132 and a portion of the first inorganic layer 131 directly formed on the dam 140 are integrally formed. Thus, permeation of external moisture and/or oxygen may be suppressed.

Figure 5:
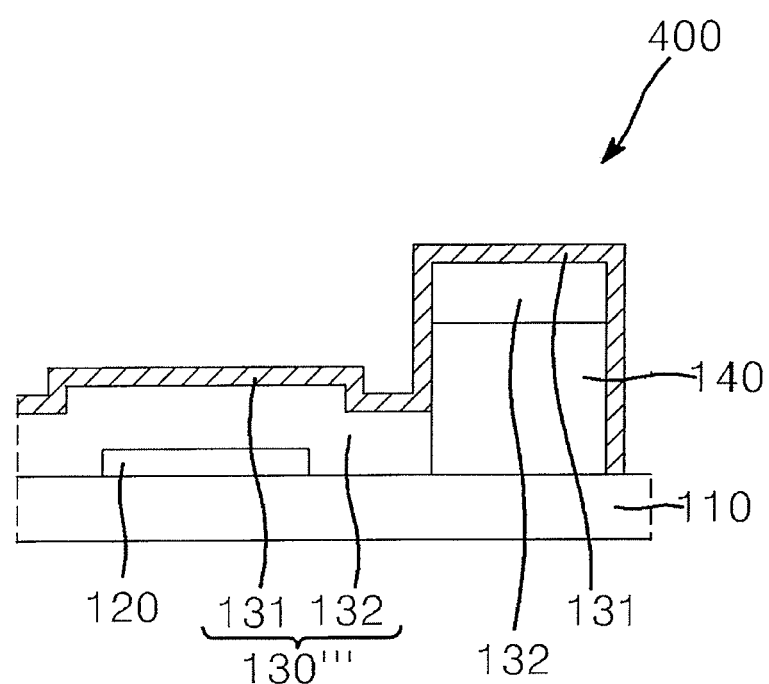
FIG. 5 is a partial cross-sectional view of an organic light emitting display device according to yet another embodiment of the invention.

Hereinafter, an organic light emitting display according to yet another embodiment of the invention will be explained with reference to FIG. 5. FIG. 5 is a partial cross-sectional view of an organic light emitting display device according to yet another embodiment of the invention.

Referring to FIG. 5, an organic light emitting display device 400 according to the embodiment may include a substrate 110, an organic light emitting element 120, an encapsulation layer 130''', and a dam 140. Except that an encapsulation layer 130''' is formed instead of the encapsulation 130, the organic light emitting display device 300 is substantially the same with the above explained organic light emitting display device according to an embodiment of the invention. Thus, only the encapsulation layer 130''' will be explained hereinafter.

The encapsulation layer 130''' may include a first inorganic layer 131 and a first organic layer 132. The encapsulation layer 130''' is directly formed on the organic light emitting element 120, and the encapsulation layer 130''' is additionally formed on the dam 140.

The first organic layer 132 is directly formed on the organic light emitting element 120 and the dam 140. The first organic layer 132 is not formed continuously, and is separated by the dam 140 in the light emitting area and the non-light emitting area.

The first inorganic layer 131 is directly formed on the first organic layer 132. A portion of the first organic layer 132 directly formed on the first organic layer 132 and a portion of the first inorganic layer 131 directly formed on the dam 140 are integrally formed. Therefore, the organic light emitting display device 400 according to the embodiment may have a structure in which the dam 140, the first organic layer 132, and the first inorganic layer 131 are sequentially stacked on the substrate 110. Thus, permeation of external moisture and/or oxygen may be suppressed.

Hereinafter, a method of manufacturing an organic light emitting display device according to embodiments of the invention will be explained.

The organic light emitting display device according to the embodiments may include forming an organic light emitting element and a dam on a substrate, and forming an encapsulation layer on the organic light emitting element. Here, an inorganic layer and an organic layer may be alternately stacked in the encapsulation layer, and the organic layer may include a composition for encapsulating a display device according to the embodiments of the invention.

An organic light emitting element and a dam are formed on a substrate. First, an anode is formed on a substrate. A light emitting layer is formed by a dry coating such as a vacuum deposition, sputtering, plasma plating and ion plating, or a wet coating such as spin coating, dip coating, and flow coating, and a cathode is formed thereon to manufacture an organic light emitting element on a substrate. The dam may be formed by stacking a predetermined abovementioned material in an area surrounding the organic light emitting element.

The inorganic layer is formed by a suitable vacuum process including sputtering, evaporation, sublimation, chemical vapor deposition (CVD), plasma enhanced chemical vapor deposition (PECVD), electron cyclotron resonance plasma enhanced chemical vapor deposition (ECR-PECVD) and combination thereof, without being limited thereto. The organic layer may be formed by vapor deposition, spin coating, printing, inkjet printing, and/or spraying, without being limited thereto. A mask may be used in forming the inorganic layer and the organic layer.

Mode for Invention

The following examples, comparative examples and test example, the configuration and effect of the invention will be described in detail. However, the examples, comparative examples and test examples are not intended to be limited by to the spirit and scope of the invention but only be provided for the purpose of illustrating examples and comparative examples and test examples to aid the understanding of the invention.

Preparation Example 1

In a 3,000 ml reactor equipped with a cooling tube and a stirrer, 300 ml of dichloromethane (Sigma Aldrich Corporation) was placed, and 200 g of 4-hydroxybutyl acrylate (Shin Nakamura Chemical Co., Ltd.) and 168 g of triethylamine were added, followed by cooling the temperature of the flask to 0° C., and adding dropwise a solution of 278 g of p-toluenesulfonyl chloride (Sigma-Aldrich Corporation) dissolved in 500 ml of dichloromethane, for 2 hours while stirring. After stirring for additional 5 hours, the remaining solvent was removed by distillation. The obtained compound 300 g was added to 1,000 ml of acetonitrile (Sigma Aldrich Corporation), and 220 g of potassium carbonate (Sigma Aldrich Corporation) and 141 g of 2-phenylphenol were added, followed by stirring at 80° C. Residual solvent and reaction residue were removed to obtain a compound of Formula 5 (molecular weight 296.36) having a purity of 93% as determined by HPLC.

[Formula 5]

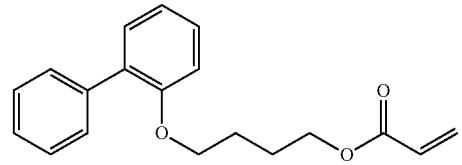

Preparation Example 2

In a 2,000 ml flask equipped with a cooling tube and a stirrer, 600 ml of dichloromethane (Sigma Aldrich Corporation) was placed, and 58.8 g of 2-hydroxyethylmethacrylate (Sigma Aldrich Corporation) and 52.2 g of triethylamine (Sigma Aldrich Corporation) were added while stirring at 0° C., followed by slowly adding 100 g of triphenylchloromethane (Sigma Aldrich Corporation). After raising the temperature to 25° C., the mixture was stirred for 4 hours. After removing dichloromethane by distillation under reduced pressure, 124 g of a compound of Formula 6 having a purity of 97% as determined by HPLC was obtained using a silica gel column.

[Formula 6]

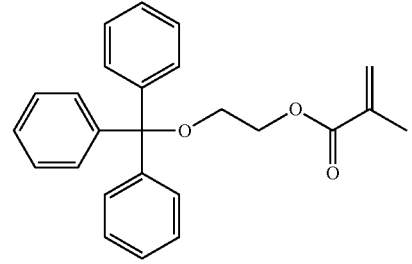

Preparation Example 3

In a 2,000 ml flask equipped with a cooling tube and a stirrer, 800 ml of acetonitrile (Fisher Scientific) was placed, and 180 g of potassium carbonate (Sigma Aldrich Corporation) and 108 g of acrylic acid were added while stirring at 0° C., followed by slowly adding 150 g of 4,4'-bis(chloromethyl)biphenyl (Tokyo Chemical Industry Co., Ltd.). After raising the temperature to 70° C., the mixture was stirred for 12 hours. After removing acetonitrile by distillation under reduced pressure, 177 g of a compound of Formula 7 having a purity of 97% as determined by HPLC was obtained using a silica gel column.

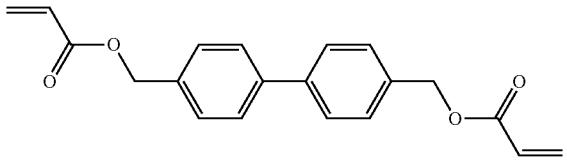

[Formula 7]

Preparation Example 4

In a 3,000 ml reactor equipped with a cooling tube and a stirrer, 300 ml of dichloromethane (Sigma Aldrich Corporation) was placed, and 200 g of 2-hydroxyethyl acrylate (Shin Nakamura Chemical Co., Ltd.) and 168 g of triethylamine were added, followed by cooling the temperature of the flask to 0° C., and adding dropwise a solution of 278 g of p-toluenesulfonyl chloride (Sigma-Aldrich Corporation) dissolved in 500 ml of dichloromethane, for 2 hours while stirring. After stirring for additional 5 hours, the remaining solvent was removed by distillation. The obtained compound 300 g was added to 1,000 ml of acetonitrile (Sigma Aldrich Corporation), and 220 g of potassium carbonate (Sigma Aldrich Corporation) and 141 g of 2-phenylphenol were added, followed by stirring at 80° C. Residual solvent and reaction residue were removed to obtain a compound of Formula 8 (molecular weight 296.36) having a purity of 93% as determined by HPLC.

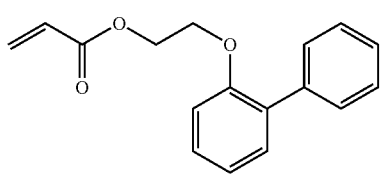

[Formula 8]

Preparation Example 5

In a 3,000 ml reactor equipped with a cooling tube and a stirrer, 300 ml of dichloromethane (Sigma Aldrich Corporation) was placed, and 400 g of 2-hydroxyethyl acrylate (Sigma Aldrich Corporation) and 168 g of triethylamine were added, followed by cooling the temperature of the flask to 0° C., and adding dropwise a solution of 278 g of p-toluenesulfonyl chloride (Sigma Aldrich Corporation) dissolved in 500 ml of dichloromethane, for 2 hours while stirring. After stirring for additional 5 hours, the remaining solvent was removed by distillation. The obtained compound 300 g was added to 1,000 ml of acetonitrile (Sigma Aldrich Corporation), and 220 g of potassium carbonate (Sigma Aldrich Corporation) and 141 g of 2,2'-biphenol (Sigma Aldrich Corporation) were added, followed by stirring at 80° C. Residual solvent and reaction residue were removed to obtain a compound of Formula 9 (molecular weight 382.41) having a purity of 91% as determined by HPLC.

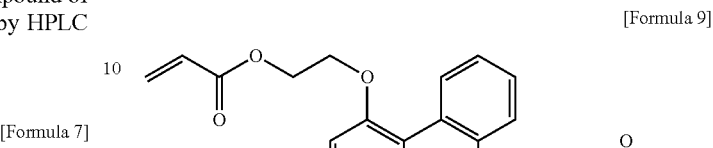

[Formula 9]

Preparation Example 6

In a 1,000 ml reactor equipped with a cooling tube and a stirrer, 100 g of benzene thiol, 200 ml of dichloromethane (Sigma Aldrich Corporation), and 8.2 g of zinc perchlorate (Sigma Aldrich Corporation) were placed, followed by stirring, and slowly adding dropwise 109.05 g of styrene oxide (Sigma Aldrich Corporation) to carry out a reaction at room temperature. After 4 hours, an inorganic material was removed using water and dichloromethane, and the residual solvent was evaporated to obtain a first product 192 g. In a 2,000 ml reactor, 150 g of the first product, 70.31 g of triethylamine (Sigma Aldrich Corporation), and 500 ml of dichloromethane were stirred at 0° C., followed by slowly adding dropwise 64.84 g of acryloyl chloride (Sigma Aldrich Corporation) to carry out a reaction. After completion of adding dropwise, the temperature was slowly raised to room temperature, followed by stirring for additional 4 hours. After completion of the reaction, the mixture was purified with n-hexane (Daejung Chemicals and Metals CO., Ltd.) to remove salts and impurities, followed by distillation of the residual solvent under reduced pressure to obtain a compound of Formula 10 (molecular weight 284.37) having a purity of 85% as determined by HPLC.

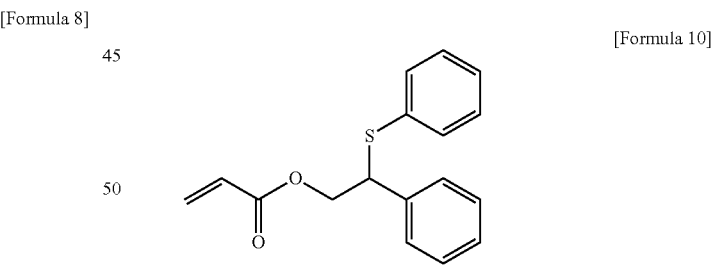

[Formula 10]

Details of components used in Examples and Comparative Examples are as follows.

(A) A monomer without an aromatic hydrocarbon:
(a1) dodecanediol dimethacrylate (Sartomer Company Inc.)
(a2) triethylene glycol dimethacrylate (BASF Corporation)
(a3) trimethylolpropane triacrylate (BASF Corporation)
(a4) 2-dimethylaminoethyl acrylate (ACROS Organics)
(B) A monomer including substituted or non-substituted at least two phenyl group:
(b1) monomer of Preparation Example 1
(b2) monomer of Preparation Example 2

(b3) monomer of Preparation Example 3
(b4) monomer of Preparation Example 4
(b5) monomer of Preparation Example 5
(b6) monomer of Preparation Example 6
(b7) CP-011 (4-cumylphenoxyethyl acrylate, Hannong Hwasung Inc.)
(b8) Bisphenol A dimethacrylate (Sigma Aldrich Corporation)
(b9) BPM-102 (Bisphenol A ethoxylated (10) dimethacrylate, Hannong Hwasung Inc.)
(b10) Bisphenol F ethoxylated (2) diacrylate (Sigma Aldrich Corporation)
(C) A photopolymerization initiator: a phosphorus initiator (Darocur TPO, BASF Corporation)

Example 1

90 parts by weight of (a1), 10 parts by weight of (b1), and 5 parts by weight of (C) were placed in a 125 ml brown polypropylene bottle, and the mixture was stirred for 3 hours with a shaker to prepare a composition for encapsulating a display device of Example 1.

Examples 2 to 25 and Comparative Examples 1 to 15

Each composition for encapsulating a display device was prepared as in the same manner with Example 1, except that each component was used as in Table 1 to Table 4.

Property Evaluation (1) Plasma etch rate (%): Each of the compositions for encapsulating a display device of Examples and Comparative Examples was applied on a 525±25 μm thick silicon wafer by spraying, followed by curing by ultraviolet ray irradiation at 100 mW/cm$^2$ for 10 seconds to prepare a 5 μm thick organic layer specimen. The prepared specimen was subjected to a plasma treatment for 1 minute with an argon gas using an ICP dry etcher (Plasma lab system 133, Oxford instruments) under the condition of ICP power 2500 W, RE power 300 W, DC bias 200V, Ar flow 50 sccm, pressure 10 mtorr. A plasma etch rate was calculated according to the following Equation 1 by measuring a thickness (T0) of an organic protective layer prior to being subjected to a plasma treatment and a thickness (T1) of an organic protective layer after being subjected to a plasma treatment, and the results are shown in Table 1 to Table 4. The thicknesses T0 and T1 each represents a thickness excluding a thickness of a substrate, and M is a plasma treatment time (min).

$$\text{Plasma etch rate (nm/min)} = (T0-T1)/M \quad \text{[Equation 1]}$$

(2) Surface roughness (nm): A specimen prepared as in above (1) was placed on an atomic force microscope (XE-100, Park Systems), and surface roughness of the specimen was measured under the condition of Head Mode: contact Mode. PSPD Display Window: A+B→1V, A−B→−500 mV~+500 mV.

(3) Color coordinate value YI (ASTM D1925): Transmittance of a specimen prepared as in above (1) was measured using an analysis equipment UV-visible spectrophotometer (UV-2450, SHIMADZU Corporation) at a wavelength of 300 nm to 800 nm, and then a color coordinate value YI (ASTM D1925) was calculated.

(4) Light transmittance (%): Total light transmittance of a specimen prepared as in above (1) was measured using a haze meter (NDH-5000, Nippon Denshoku Industries Co., Ltd.) at a wavelength of 400 nm to 700 nm according to ASTM D1003-95.

TABLE 1

| | Unit: Parts by weight | Examples | | | | | | | | | | | | |
|---|---|---|---|---|---|---|---|---|---|---|---|---|---|---|
| | | 1 | 2 | 3 | 4 | 5 | 6 | 7 | 8 | 9 | 10 | 11 | 12 | 13 |
| (A) | (a1) | 90 | 80 | 70 | 60 | 60 | 60 | — | — | — | — | — | 60 | 60 |
| | (a2) | — | — | — | — | — | — | 60 | 50 | — | — | — | — | — |
| | (a3) | — | — | — | — | — | — | 20 | — | 30 | 30 | — | — | — |
| | (a4) | — | — | — | — | — | — | — | 20 | 30 | 30 | 60 | — | — |
| (B) | (b1) | 10 | 20 | 30 | 40 | — | — | 20 | 30 | — | — | — | — | — |
| | (b2) | — | — | — | — | 40 | — | — | — | 40 | — | 20 | — | — |
| | (b3) | — | — | — | — | — | 40 | — | — | — | 40 | 20 | — | — |
| | (b4) | — | — | — | — | — | — | — | — | — | — | — | 40 | — |
| | (b5) | — | — | — | — | — | — | — | — | — | — | — | — | 40 |
| | (b6) | — | — | — | — | — | — | — | — | — | — | — | — | — |
| | (b7) | — | — | — | — | — | — | — | — | — | — | — | — | — |
| | (b8) | — | — | — | — | — | — | — | — | — | — | — | — | — |
| | (b9) | — | — | — | — | — | — | — | — | — | — | — | — | — |
| | (b10) | — | — | — | — | — | — | — | — | — | — | — | — | — |
| | (C) | 5 | 5 | 5 | 5 | 5 | 5 | 5 | 5 | 5 | 5 | 5 | 5 | 5 |
| Plasma etch rate (nm/min) | | 385 | 364 | 357 | 331 | 328 | 342 | 353 | 341 | 320 | 336 | 326 | 325 | 342 |
| Surface roughness (nm) | | 1.24 | 1.33 | 1.52 | 1.83 | 1.86 | 1.65 | 1.44 | 1.64 | 1.87 | 1.73 | 1.74 | 1.83 | 1.54 |
| Color coordinate value YI | | 0.41 | 0.41 | 0.41 | 0.41 | 0.4 | 0.42 | 0.41 | 0.41 | 0.42 | 0.42 | 0.41 | 0.41 | 0.41 |
| Light transmittance (%) | | 99 | 99 | 99 | 99 | 99 | 99 | 99 | 99 | 99 | 99 | 99 | 99 | 99 |

TABLE 2

| Unit: Parts by weight | | Examples | | | | | | | | | | | |
|---|---|---|---|---|---|---|---|---|---|---|---|---|---|
| | | 14 | 15 | 16 | 17 | 18 | 19 | 20 | 21 | 22 | 23 | 24 | 25 |
| (A) | (a1) | 60 | — | — | — | — | — | 60 | 60 | 60 | 60 | — | — |
| | (a2) | — | 50 | — | 60 | — | 30 | — | — | — | — | 70 | — |
| | (a3) | — | — | 30 | — | 70 | — | — | — | — | — | — | 70 |
| | (a4) | — | 20 | 30 | — | — | 30 | — | — | — | — | — | — |
| (B) | (b1) | — | — | — | — | — | — | — | — | — | — | — | 20 |
| | (b2) | — | — | — | — | — | — | — | — | — | — | — | — |
| | (b3) | — | — | — | 20 | — | — | — | — | — | — | — | — |
| | (b4) | — | 30 | — | — | 20 | — | 35 | 35 | 35 | 35 | — | — |
| | (b5) | — | — | 40 | 20 | — | 20 | — | — | — | — | 20 | — |
| | (b6) | 40 | — | — | — | 10 | 20 | — | — | — | — | — | — |
| | (b7) | — | — | — | — | — | — | 5 | — | — | — | — | — |
| | (b8) | — | — | — | — | — | — | — | 5 | — | — | 10 | — |
| | (b9) | — | — | — | — | — | — | — | — | 5 | — | — | — |
| | (b10) | — | — | — | — | — | — | — | — | — | 5 | — | 10 |
| (C) | | 5 | 5 | 5 | 5 | 5 | 5 | 5 | 5 | 5 | 5 | 5 | 5 |
| Plasma etch rate (nm/min) | | 360 | 340 | 335 | 338 | 348 | 328 | 323 | 320 | 320 | 321 | 354 | 352 |
| Surface roughness (nm) | | 1.74 | 1.64 | 1.68 | 1.53 | 1.74 | 1.52 | 1.83 | 1.82 | 1.83 | 1.82 | 1.63 | 1.64 |
| Color coordinate value YI | | 0.43 | 0.42 | 0.41 | 0.41 | 0.42 | 0.42 | 0.42 | 0.42 | 0.42 | 0.42 | 0.42 | 0.42 |
| Light transmittance (%) | | 100 | 99 | 99 | 99 | 99 | 99 | 99 | 99 | 99 | 99 | 99 | 99 |

TABLE 3

| Unit: Parts by weight | | Comparative Examples | | | | | | | |
|---|---|---|---|---|---|---|---|---|---|
| | | 1 | 2 | 3 | 4 | 5 | 6 | 7 | 8 |
| (A) | (a1) | 100 | 50 | 60 | 95 | — | — | — | — |
| | (a2) | — | — | 40 | — | 40 | — | — | 50 |
| | (a3) | — | — | — | 5 | — | 20 | — | — |
| | (a4) | — | — | — | — | — | 20 | 40 | — |
| (B) | (b1) | — | 50 | — | — | 60 | — | — | — |
| | (b2) | — | — | — | — | — | — | 30 | 20 |
| | (b3) | — | — | — | — | — | 60 | 30 | — |
| | (b4) | — | — | — | — | — | — | — | 30 |
| | (b5) | — | — | — | — | — | — | — | — |
| | (b6) | — | — | — | — | — | — | — | — |
| | (b7) | — | — | — | — | — | — | — | — |
| | (b8) | — | — | — | — | — | — | — | — |
| | (b9) | — | — | — | — | — | — | — | — |
| | (b10) | — | — | — | — | — | — | — | — |
| (C) | | 5 | 5 | 5 | 5 | 5 | 5 | 5 | 5 |
| Plasma etch rate (nm/min) | | 418 | 327 | 610 | 820 | 280 | 314 | 308 | 312 |
| Surface roughness (nm) | | 1.14 | 2.16 | 1.24 | 1.22 | 3.42 | 2.43 | 3.13 | 2.24 |
| Color coordinate value YI | | 0.41 | 0.41 | 0.41 | 0.41 | 0.45 | 0.46 | 0.44 | 0.41 |
| Light transmittance (%) | | 99 | 99 | 99 | 99 | 99 | 99 | 99 | 99 |

TABLE 4

| Unit: Parts by weight | | Comparative Examples | | | | | | |
|---|---|---|---|---|---|---|---|---|
| | | 9 | 10 | 11 | 12 | 13 | 14 | 15 |
| (A) | (a1) | — | — | 50 | — | — | 30 | — |
| | (a2) | — | — | — | — | 30 | — | — |
| | (a3) | 30 | — | — | 50 | — | — | 50 |
| | (a4) | — | 40 | — | — | 20 | 20 | — |
| (B) | (b1) | — | — | — | — | — | — | 30 |
| | (b2) | — | — | — | — | — | — | — |
| | (b3) | — | — | — | — | — | — | — |
| | (b4) | 40 | — | — | — | — | — | — |
| | (b5) | 30 | 30 | — | — | 30 | — | — |
| | (b6) | — | 30 | — | 30 | — | 30 | — |
| | (b7) | — | — | 50 | 20 | — | — | — |
| | (b8) | — | — | — | — | 20 | — | — |
| | (b9) | — | — | — | — | — | — | 20 |
| | (b10) | — | — | — | — | — | 20 | — |
| (C) | | 5 | 5 | 5 | 5 | 5 | 5 | 5 |
| Plasma etch rate (nm/min) | | 296 | 310 | 324 | 318 | 287 | 320 | 322 |
| Surface roughness (nm) | | 3.35 | 3.14 | 2.54 | 2.43 | 3.65 | 2.44 | 2.42 |
| Color coordinate value YI | | 0.41 | 0.43 | 0.46 | 0.45 | 0.48 | 0.45 | 0.45 |
| Light transmittance (%) | | 99 | 100 | 99 | 99 | 95 | 99 | 99 |

As shown in Table 1 to Table 4, each specimen in Examples has a low plasma etch rate, good plasma resistance, and good flatness which has a surface roughness of 2 nm or less. Further, each specimen in Examples has a color coordinate value YI (ASTM D1925) of 0.50 or less and high transmittance. Thus, a transparent organic layer may be provided. On the other hand, each specimen in Comparative Examples has a problem for having a high etch rate or high surface roughness as compared with that of Examples.

While certain embodiments of the invention have been illustrated and described, it is understood that various modifications, changes, alterations, and equivalent embodiments can be made by those skilled in the art without departing from the spirit and scope of the invention, as defined in the following claims. It should be understood that various modifications, changes, alterations, and equivalent embodiments can be made by those skilled in the art without departing from the spirit and scope of the invention.

The invention claimed is:

1. An organic light emitting display device comprising:
   a substrate comprising a light emitting area, and a non-light emitting area disposed outside of the light emitting area;
   at least one organic light emitting element formed on the light emitting area;
   an encapsulation layer encapsulating the organic light emitting element; and
   a dam formed on the non-light emitting area,
   wherein the encapsulation layer has a structure in which at least one inorganic layer and at least one organic layer are alternately stacked one above another,
   and the organic layer comprises a composition for encapsulating a display device,
   the composition for encapsulating a display device comprising a photocurable monomer and a photopolymerization initiator,
   the photocurable monomer comprising a monomer without an aromatic hydrocarbon; and
   a monomer of following Formula 1 comprising substituted or non-substituted at least two phenyl groups,
   the photocurable monomer comprising about 5 wt % to about 45 wt % of the monomer comprising substituted or non-substituted at least two phenyl groups and about 55 wt % to about 95 wt % of the monomer without an aromatic hydrocarbon:

[Formula 1]

wherein in Formula 1, A is a hydrocarbon comprising substituted or non-substituted at least two phenyl groups, or a hetero atom-containing hydrocarbon comprising substituted or non-substituted at least two phenyl groups,
$Z^1$ and $Z^2$ are each independently a compound of following Formula 2,
a and b are each independently an integer of 0 to 2, and a+b is an integer of 1 to 4:

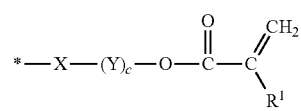

[Formula 2]

wherein in Formula 2, * is a portion connected to a carbon atom of A in Formula 1,
X is a single bond, O or S,
Y is a substituted or non-substituted straight chain alkylene group having 1 to 10 carbon atoms, or a substituted or non-substituted alkoxylene group having 1 to 20 carbon atoms,
$R^1$ is hydrogen or an alkyl group having 1 to 5 carbon atoms, and
c is 0 or 1.

2. The organic light emitting display device according to claim 1, wherein one organic layer has a thickness of about 0.2 μm to about 15 μm.

3. The organic light emitting display device according to claim 1, wherein the inorganic layer comprises at least one of silicon oxide, silicon nitride, silicon oxynitride, ZnSe, ZnO, $Sb_2O_3$, $Al_2O_3$, $In_2O_3$, or $SnO_2$.

4. The organic light emitting display device according to claim 1, wherein the inorganic layer is additionally formed on the dam.

5. The organic light emitting display device according to claim 4, wherein the inorganic layer comprises a first inorganic layer and a second inorganic layer,
and wherein the organic light emitting display device has a structure in which the dam, the first inorganic layer, and the second inorganic layer are sequentially stacked on the substrate.

6. The organic light emitting display device according to claim 4, wherein the inorganic layer comprises a first inorganic layer,
and wherein the organic light emitting display device has a structure in which the dam and the first inorganic layer are sequentially stacked on the substrate.

7. The organic light emitting display device according to claim 1, wherein the encapsulation layer is additionally formed on the dam.

8. The organic light emitting display device according to claim 7, wherein the inorganic layer comprises a first inorganic layer and a second inorganic layer, and the organic layer comprises a first organic layer,
and wherein the organic light emitting display device has a structure in which the dam, the first inorganic layer, the first organic layer, and the second inorganic layer are sequentially stacked on the substrate.

9. The organic light emitting display device according to claim 7, wherein the inorganic layer comprises a first inorganic layer, and the organic layer comprises a first organic layer,
and wherein the organic light emitting display device has a structure in which the dam, the first organic layer, and the first inorganic layer are sequentially stacked on the substrate.

10. The organic light emitting display device according to claim 8, wherein the first organic layer in the light emitting area is separated from the first organic layer in the non-light emitting area by the dam.

11. The organic light emitting display device according to claim 1, wherein the monomer comprising substituted or non-substituted at least two phenyl groups comprises at least one of mono(meth)acrylate and di(meth)acrylate.

12. The organic light emitting display device according to claim 11, wherein the mono(meth)acrylate compound is represented by following Formula 3:

[Formula 3]

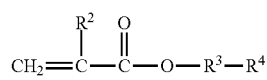

wherein in Formula 3, $R^2$ is hydrogen or a methyl group,
$R^3$ is a substituted or non-substituted straight chain alkylene group having 1 to 10 carbon atoms, or a substituted or non-substituted alkoxylene group having 1 to 20 carbon atoms, and
$R^4$ is a hydrocarbon comprising substituted or non-substituted at least two phenyl groups, or a hetero atom-containing hydrocarbon comprising substituted or non-substituted at least two phenyl groups.

13. The organic light emitting display device according to claim 11, wherein the di(meth)acrylate compound is represented by Formula 4:

[Formula 4]

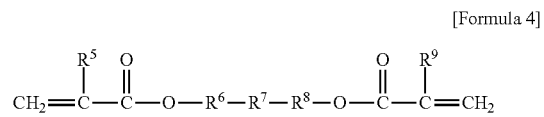

wherein in Formula 4, $R^5$ and $R^9$ are each independently hydrogen or a methyl group,
$R^6$ and $R^8$ are each independently a substituted or non-substituted straight chain alkylene group having 1 to 10 carbon atoms, or a substituted or non-substituted alkoxylene group having 1 to 20 carbon atoms, and
$R^7$ is a hydrocarbon comprising substituted or non-substituted at least two phenyl groups, or a hetero atom-containing hydrocarbon comprising substituted or non-substituted at least two phenyl groups.

14. The organic light emitting display device according to claim 1, wherein the monomer comprising substituted or non-substituted at least two phenyl groups comprises one of 4-(meth)acryloxy-2-hydroxybenzophenone, ethyl-3,3-diphenyl(meth)acrylate, benzoyloxyphenyl(meth)acrylate, bisphenol A di(meth)acrylate, ethoxylated bisphenol A di(meth)acrylate, bisphenol F di(meth)acrylate, ethoxylated bisphenol F di(meth)acrylate, 4-cumylphenoxyethyl(meth)acrylate, ethoxylated bisphenylfluorenedi(meth)acrylate, 2-phenylphenoxyethyl(meth)acrylate, 2,2'-phenylphenoxyethyldi(meth)acrylate, 2-phenylphenoxypropyl(meth)acrylate, 2,2'-phenylphenoxypropyldi(meth)acrylate, 2-phenylphenoxybutyl(meth)acrylate, 2,2'-phenylphenoxybutyldi(meth)acrylate, 2-(3-phenylphenyl)ethyl(meth)acrylate, 2-(4-benzylphenyl)ethyl(meth)acrylate, 2-phenyl-2-(phenylthio)ethyl(meth)acrylate, 2-(triphenylmethyloxy)ethyl(meth)acrylate, 4-(triphenylmethyloxy)butyl(meth)acrylate, 3-(biphenyl-2-yloxy)butyl(meth)acrylate, 2-(biphenyl-2-yloxy)butyl(meth)acrylate, 4-(biphenyl-2-yloxy)propyl(meth)acrylate, 3-(biphenyl-2-yloxy)propyl(meth)acrylate, 2-(biphenyl-2-yloxy)propyl (meth)acrylate, 4-(biphenyl-2-yloxy)ethyl(meth)acrylate, 3-(biphenyl-2-yloxy)ethyl(meth)acrylate, 2-(4-benzylphenyl)ethyl(meth)acrylate, 4,4'-di((meth) acryloyloxymethyl)biphenyl, 2,2'-di(2-(meth)acryloyloxyethoxy)biphenyl, or mixtures thereof.

15. The organic light emitting display device according to claim 1, wherein the hydrocarbon comprising substituted or non-substituted at least two phenyl groups, or the hetero atom-containing hydrocarbon comprising substituted or non-substituted at least two phenyl groups comprises a substituted or non-substituted biphenyl group, a substituted or non-substituted triphenylmethyl group, a substituted or non-substituted terphenyl group, a substituted or non-substituted biphenylene group, a substituted or non-substituted terphenylene group, a substituted or non-substituted quarterphenylene group, a substituted or non-substituted 2-phenyl-2-(phenylthio)ethyl group, a substituted or non-substituted 2,2-diphenylpropane group, a substituted or non-substituted diphenylmethane group, a substituted or non-substituted cumylphenyl group, a substituted or non-substituted bisphenol F group, a substituted or non-substituted bisphenol A group, a substituted or non-substituted biphenyloxy group, a substituted or non-substituted terphenyloxy group, a substituted or non-substituted quarterphenyloxy group, or a substituted or non-substituted quinquephenyloxy group.

16. The organic light emitting display device according to claim 1, wherein the monomer comprising substituted or non-substituted at least two phenyl groups has a molecular weight of about 100 g/mol to about 1,000 g/mol.

17. The organic light emitting display device according to claim 1, wherein the monomer without an aromatic hydrocarbon comprises at least one of mono(meth)acrylate comprising an amine group, di(meth)acrylate comprising a substituted or non-substituted alkylene group having 1 to 20 carbon groups, di(meth)acrylate comprising an ethylene oxide group, tri(meth)acrylate comprising an ethylene oxide group, or trimethylolpropane tri(meth)acrylate.

18. The organic light emitting display device according to claim 1, wherein the photocurable monomer is formed only of at least one element selected from the group consisting of C, H, O, N or S.

19. The organic light emitting display device according to claim 1, wherein the photopolymerization initiator comprises at least one selected from the group consisting of a triazine initiator, an acetophenone initiator, a benzophenone initiator, a thioxanthone initiator, a benzoin initiator, a phosphorus initiator, and an oxime initiator.

20. The organic light emitting display device according to claim 1, wherein the composition for encapsulating a display device further comprises a heat stabilizer.

* * * * *